United States Patent
Surico et al.

(10) Patent No.: US 8,456,917 B1
(45) Date of Patent: Jun. 4, 2013

(54) LOGIC CIRCUIT FOR A SEMICONDUCTOR MEMORY DEVICE, AND METHOD OF MANAGING AN OPERATION IN THE SEMICONDUCTOR MEMORY DEVICE

(75) Inventors: Stefano Surico, Agrate Brianza (IT); Giuseppe Moioli, Agrate Brianza (IT)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/306,741

(22) Filed: Nov. 29, 2011

(51) Int. Cl.
*G11C 11/34* (2006.01)
*H03K 19/173* (2006.01)

(52) U.S. Cl.
USPC ............ 365/185.21; 365/185.03; 365/185.12; 365/189.15; 365/189.08; 326/38

(58) Field of Classification Search
USPC .................... 326/38–41; 365/185.21, 185.03, 365/185.12, 185.18, 189.15, 189.08, 189.09; 711/118, 104, 103, 220
See application file for complete search history.

(56) References Cited

U.S. PATENT DOCUMENTS

| | | | |
|---|---|---|---|
| 6,405,260 B2 * | 6/2002 | Kang et al. | 709/250 |
| 6,937,510 B2 * | 8/2005 | Hosono et al. | 365/185.03 |
| 7,286,382 B1 * | 10/2007 | Vadi et al. | 365/189.15 |
| 7,397,686 B2 * | 7/2008 | Takashima et al. | 365/145 |
| 7,602,644 B2 * | 10/2009 | Lee et al. | 365/185.12 |
| 7,639,544 B2 * | 12/2009 | Hosono et al. | 365/185.21 |
| 7,739,443 B2 * | 6/2010 | Aizawa | 711/103 |
| 7,861,059 B2 * | 12/2010 | Magliocco et al. | 711/220 |
| 8,063,660 B1 * | 11/2011 | Strader et al. | 326/40 |
| 8,064,264 B2 * | 11/2011 | Shinozaki et al. | 365/185.22 |
| 8,140,739 B2 * | 3/2012 | Langlois et al. | 711/103 |
| 8,283,944 B2 * | 10/2012 | Kuroda | 326/37 |

* cited by examiner

*Primary Examiner* — Vibol Tan
(74) *Attorney, Agent, or Firm* — McGinn IP Law Group, PLLC

(57) ABSTRACT

A logic circuit for a semiconductor memory device, includes a first logic portion which stores data from a first data signal, and generates a second data signal based on the first data signal, a second logic portion which generates a first address signal and stores an address from the first address signal where data from the second data signal is to be written, and a third logic portion which generates a flag signal which indicates whether the data stored in the first logic portion is valid.

20 Claims, 15 Drawing Sheets

| Signal Name (1) | Input/ Output | Description |
|---|---|---|
| R/B# | O | Ready/Busy The Ready/Busy signal indicates the device status. When low, the signal indicates that one operation is in progress. This signal is an open drain output and requires an external pull-up. |
| RE# | I | Read Enable The Read Enable signal enables serial data output. |
| WE# | I | Write Enable The Write Enable signal controls the latching of input data in the asynchronous data interface. Data, commands, and addresses are latched on the rising edge of WE#. |
| CE# | I | Chip Enable The Chip Enable signal selects the device. When Chip Enable is high and the device is in the ready state, the device goes into a low-power standby state. When Chip Enable is low, the device is selected. |
| CLE | I | Command Latch Enable The Command Latch Enable signal is one of the signals used by the host to indicate the type of bus cycle (command, address, and data). When high, a command is latched on the rising edge of WE#. |
| ALE | I | Address Latch Enable The Address Latch Enable signal is one of the signals used by the host to indicate the type of bus cycle (command, address, and data). When high, an address is latched on the rising edge of WE#. |
| WP# | I | Write Protect The Write Protect signal disables Flash array program and erase operations. When high, program/erase operations are allowed; when low, program/erase operations are inhibited. |
| IO0-IO7 (IO0-IO15) | I/O | I/O Port 1, bits 0-7 The I/O port is an 8-bit wide bidirectional port for transferring address, command, and data to and from the device. I/O Port 1, bits 8-15 These signals are only available in x16 configuration for the upper 8 bits for the 16-bit wide bidirectional port to transfer data to and from the device. |
| Vcc | I | Power The Vcc signal is the power supply to the device. |
| Vss | I | Ground The Vss signal is the power supply ground. |
| N.C. | | No connection These pins shall not be connected by the host. |

(Related Art)

Figure 4 (Related Art)    400

LOGIC CIRCUIT FOR A SEMICONDUCTOR MEMORY DEVICE, AND METHOD OF MANAGING AN OPERATION IN THE SEMICONDUCTOR MEMORY DEVICE

BACKGROUND OF THE INVENTION

1. Field of the Invention

The present invention relates to a semiconductor memory device, and more particularly, a data receiving circuit for a NAND flash memory.

2. Description of the Related Art

In a flash memory a very high number of operations can be executed. The flash memory is required to execute one of the possible operations described in the command set by using flash memory pads. That is, for each command (e.g., read request, write request, etc.), there is a protocol describing how the pads must be driven (e.g., voltages, timing).

FIG. 1 illustrates a typical pinout 100 of a conventional flash memory device (e.g., a NAND pinout).

In the pinout 100 of the conventional flash memory device, the command interface acquires and recognizes commands by control signals (ALE, CLE), synchronization signals (CE #,WE #,RE #), and a data signal (IO) and "translates" this information in internal operations to be executed. Some of these operations determine the start of the execution (typically from a read only memory (ROM)) of an algorithm that controls a very complex sequence of signals, voltages and timings in order to ensure the success of requirements. During algorithm execution the ready/busy signal (R/B #) is low and no other algorithm operations can be executed.

An important subset of all possible commands pertains to programming of a "portion" of a matrix (e.g., an array of non-volatile memory cells). A flash memory (e.g., flash NAND) is organized in one or more planes, each plane being made of blocks (minimum erasable unit), each block being divided into pages (maximum programmable area in a plane), and each page being made of bytes (in recent years, the number of bytes in a page has increased by 512 B to 8 KB).

An address used in a flash memory device is loaded by five Address Latch Enable (ALE) cycles. The first two cycles permit loading of the "column address" that identifies the position of a byte in the page space, and the remaining three loaded bytes (referred to as "row address") allow the page inside the matrix organization to be identified.

A basic program command is a page program that is a sequence of command setup (a command is provided by the data signal (IO) and a command latch enable signal (CLE)), five address cycles, insertion of N bytes (data to be programmed at a selected page; this portion of command may be referred to as a "data-in" operation) and a confirm command that starts the execution of a programming algorithm.

FIG. 2 illustrates a timing diagram 200 for a standard Open NAND Flash Interface (ONFI) page program command. As illustrated in FIG. 2, in the page program command, command setup is 80 h, and command confirm is 10 h. Further, C1, C2 form the column address, and R1, R2, R3 form the row address. Other NAND specifications on the market may have a different setup/confirm code but the format is the same.

In recent memory devices (e.g., flash memory devices such as a NAND memory device), page dimension has significantly increased, due to a need to enhance parallel programming. The greater the number of bytes in a page, the more time that is required for the "data-in" phase. The only parameter that can be used to limit this time is the reduction of data cycle (e.g., the time to load a single byte into a buffer or random access memory (RAM)). Therefore, the duration of the data cycle (e.g., tWC in the timing diagram 200 in FIG. 2) is required to be shorter and shorter (e.g., less than 10 nanoseconds) in recent NAND flash specifications.

Program time, as illustrated below in Equation 1, is the result of the addition of time used for "data-in" phase and time spent during algorithm execution. It should be noted that time contributions of command setup, confirm and address loading are very short and, therefore, have been ignored in Equation 1.

$$T\text{program} = T\text{data\_in} + T\text{algo\_exec} = N * tWC + T\text{algo\_exec} \quad \text{(Equation 1)}$$

where:

Talgo_exec=time to execute algorithm from ROM after command phase;

Tdata_in =time to preload in a buffer or RAM data to be programmed;

N=number of maximum bytes can be programmed in a page;

tWC=time to load a single byte into buffer or RAM;

Talgo_exec depends on flash memory technology and its typical time is in a range from 100 to 150 µs; and Tdata_in depends on how many bytes are storable (programmable by the same algorithm) in a page by tWC that represents how fast each data is provided to flash.

As noted above, in recent years (e.g., last year's evolution), N has gone from 510 B to 8 KB. As a consequence, a way to limit program time explosion has been to decrease a duration of tWC and provide a very aggressive setup and hold time for the data validity window. However, this makes it more difficult to manage by design a "bug free" implementation of all kinds of program commands.

Besides, as inserted bytes are required to be processed by a particular flash logic (e.g., redundancy logic), the insertion of a pipeline architecture is inevitable and must be handled with aggressive timing. An important feature to take into account is that in flash memory specifications (e.g., NAND flash specifications), a dedicated bus for data-in does not exist. That is, the bus is the same (e.g., multiplexed inside device) for the address, commands and data. This means that the architecture must classify data as either valid data or invalid data in a short time.

The main program operations that data-in path architecture must be able to handle are 1) Page program, 2) Change Write Column (CWC), 3) Copyback Program, and 4) Multiplane (or interleaved) Page program or copyback program.

Page Program

A Page Program (e.g., as illustrated in FIG. 2) refers to the standard situation described up to now that is loading into a buffer or RAM up to N bytes to be programmed. The typical format for this operation is:

Providing a single setup command cycle with a known code on IO (CLE+IO=80 h)

Providing 5 cycles to load page address (5×ALE+ IO=ADD<i>)

Providing n data cycles to store D0 . . . D(n−1) bytes within the buffer (IO=BYTE <i>)

Providing a single confirm command cycle with a known code (CLE+IO=10 h)

After the confirm command cycle, the algorithm phase begins.

Other specification requests that the architecture must manage are:

a) the starting address inside the page can be arbitrary;

b) the number of loaded bytes can be an arbitrary number K;

c) bytes are loaded to sequential address;

d) inside the data-in phase, "spurious" address cycles could be provided (and must be ignored); and e) if data-in overcome addressable area must be ignored.
Change Write Column (CWC)

FIG. 3 illustrates a timing diagram 300 for Change Write Column (CWC) command from the ONFI specification. CWC represents a possibility of changing an address inside the page to permit loading of data within the page which is other than a sequential loading. This may be helpful because if only a few bytes are to be programmed into "far" address locations, then a sequential approach causes a high Tdata_in since it may be necessary to scan the entire addressable page space to reach the most distant address locations.

For instance, if it is required to load only two bytes, one at the first page address and the other at the last page address, and a standard page program command is used, then Tdata_in=N*tWC, where N is the whole page size and typical values cause Tdata_in of dozens of microseconds.

However, by using a CWC command in such a situation, Tdata_in=2*Tdcycle. The amount of Tdata_in this case is less than hundred nanoseconds. For this reason CWC is very important and it is another situation that data-in architecture has to manage.

The typical format for the CWC operation is:
A setup command cycle inside the data-in phase of a page program, copyback or multi plane program (CLE+ IO=85 h)
two address cycles to change column address (2×ALE+ 10=ADD)
m data cycles to store m bytes within the buffer (DBUS=BYTE <i>)

It should be noted that no confirm command is required for this operation. Besides, it can be repeated many times inside the same program operation.

Copy-Back Program

FIG. 4 illustrates a timing diagram 400 for a Copy-back program with CWC. This command has been introduced to decrease the time required to "copy" a page from its original page address to another page of same plane, a typical operation in a flash memory. To do this, first a read from original page occurs and page information is stored into the buffer (or RAM). Then, by using the copy-back program, a re-programming to a final new address is executed.

Due to technology shrinking, this operation can be affected by some failing bits. Thus, the operation is often achieved by a readout of the buffer and correction of failing bits by using an error correction code (ECC) algorithm. This is a typical case in which only a few bytes stored in the buffer have to be changed, which is the reason why CWC is often used inside the copy-back program.

The typical format for the copy-back program is:
Setup command cycle with a known code on IO (CLE+ IO=85 h)>
five ALE cycles to load page address (5×ALE+ IO=ADD<i>)
k data cycles to store k bytes within the buffer (IO=BYTE <i>)
Confirm command cycle with a known code (CLE+IO=10 h)

Unlike the page program, after setup, the buffer does not need to be preset because the buffer stores valid information (deriving from previous "read for copy-back").

Multiplane Page Program or Multiplane Copy-Back Program

FIG. 5 illustrates a timing diagram 500 for a multiplane (e.g., interleaved) page program or a multiplane copy-back program.

High parallelism is one of the most important features of memory devices (e.g., NAND devices) and, therefore, multiplane program requirements have also been introduced into specifications (e.g., NAND specifications). In the case of a multiplane program, an object is to minimize Tprogram by permitting an algorithm to "work" on a double page space. If the multiplane program is not supported, then Tprogram from Equation 1 is required to be doubled.

However, if a multiplane program is supported, then Tprogram is given by Equation 2:

$$T\text{program}=2*T\text{data\_in}+T\text{algo\_exec}=2*N*tWC+T\text{algo\_exec} \quad \text{(Equation 2)}$$

Talgo_exec is about the same both in a single and multiplane page program. The multiplane program can be extended to the copy-back program by permitting two pages of different planes to be moved into two different destination pages. The format of command for the multiplane copy-back program is exactly the same as the format in the timing diagram 500 illustrated in FIG. 5, except that a different code is used on in the setup command.

The typical format for multiplane page program is:
setup command cycle with a known code on IO (CLE+ IO=80 h)
five ALE cycles to load page address (5×ALE+ IO=ADD<i>)
Na data cycles to store Na bytes within the left buffer (IO=BYTE <i>)
First phase confirm command cycle with a known code (CLE+IO=11 h)
Waiting for a tIPBSY before providing next phase setup command
Second plane setup command cycle with a known code on DBUS (CLE+DBUS=81 h)
5 ALE cycles to load initial page address in the right plane (5×ALE+DBUS=ADD<i>)
Nb data cycles to store Nb bytes within the buffer (IO=BYTE <i>)
Confirm command cycle within a known code (CLE+ DBUS=10 h)

After the last confirm command cycle, the algorithm phase begins.

The multiplane copy-back program is similar to the multiplane page program, except that the preset is not generated after setup in the multiplane copy-back program. For both the multiplane page program and the multiplane copy-back, CWC must be supported.

SUMMARY OF THE INVENTION

According to an exemplary aspect of the present invention, a logic circuit for a semiconductor memory device includes a first logic portion (DATA_FIELD) which stores data from a first data signal(IO<7:0), and generates a second data signal (D_FM_PIPE1) based on the first data signal, a second logic portion (ADD_FIELD) which generates a first address signal (A_FM_PIPE1), and stores an address from the first address signal where data from the second data signal is to be written, and a third logic portion (FLAG_FIELD) which generates a flag signal (FLAGS0) which indicates whether the data stored in the first logic portion is valid.

According to another exemplary aspect of the present invention, a device may include a set of terminals supplied with a plurality of input data in sequence, an input circuit coupled to the set of terminals to receive each of the input data in sequence, the input circuit being configured to temporarily store each of the input data and producing in sequence a plurality of internal data corresponding respectively to the input data with a plurality of flag signals, each of the flag signals accompanying an associated one of the internal data and taking one of first and second states, the first state indicating that an accompanied one of the internal data is valid and the second state indicating that the accompanied one of the internal data is invalid, a storage area, and a control circuit coupled between the input circuit and the storage area and configured to respond to the flag signals and write into the storage area one or ones of the internal data that is or are indicated to be valid by the first state of associated one or ones of the flag signals with preventing the storage area from being written with remaining one or ones of the internal data that is or are indicated to be invalid by the second state of the flag signals.

According to still another exemplary aspect of the present invention, a device may include a nonvolatile memory cell array, a page buffer temporarily storing data to be written into the nonvolatile memory cell array, a volatile memory cell array temporarily storing data to be written into the page buffer, a pad circuit receiving a plurality of input data in sequence; and a pipeline circuit coupled between the pad circuit and the volatile memory cell array, the pipeline circuit being configured to produce in sequence a plurality of internal data in response respectively to the input data with a plurality of flag signals to be accompanied respectively by the internal data, each of the flag signals taking a first level when an associated one of the internal data is valid and a second level when the associated one of the internal data is invalid, the pipeline circuit being further configured to write into the volatile memory cell array such one or ones of the internal data that accompany corresponding flag signal or signals each taking the first level, the one or ones of the internal data that accompany corresponding flag signal or signals each taking the first level being thereby written into the nonvolatile memory cell array through the page buffer.

BRIEF DESCRIPTION OF THE DRAWINGS

FIG. 1 illustrates a typical pinout 100 of a conventional flash memory device (e.g., a NAND pinout).

DETAILED DESCRIPTION OF EXEMPLARY EMBODIMENTS OF THE INVENTION

Figure 2:
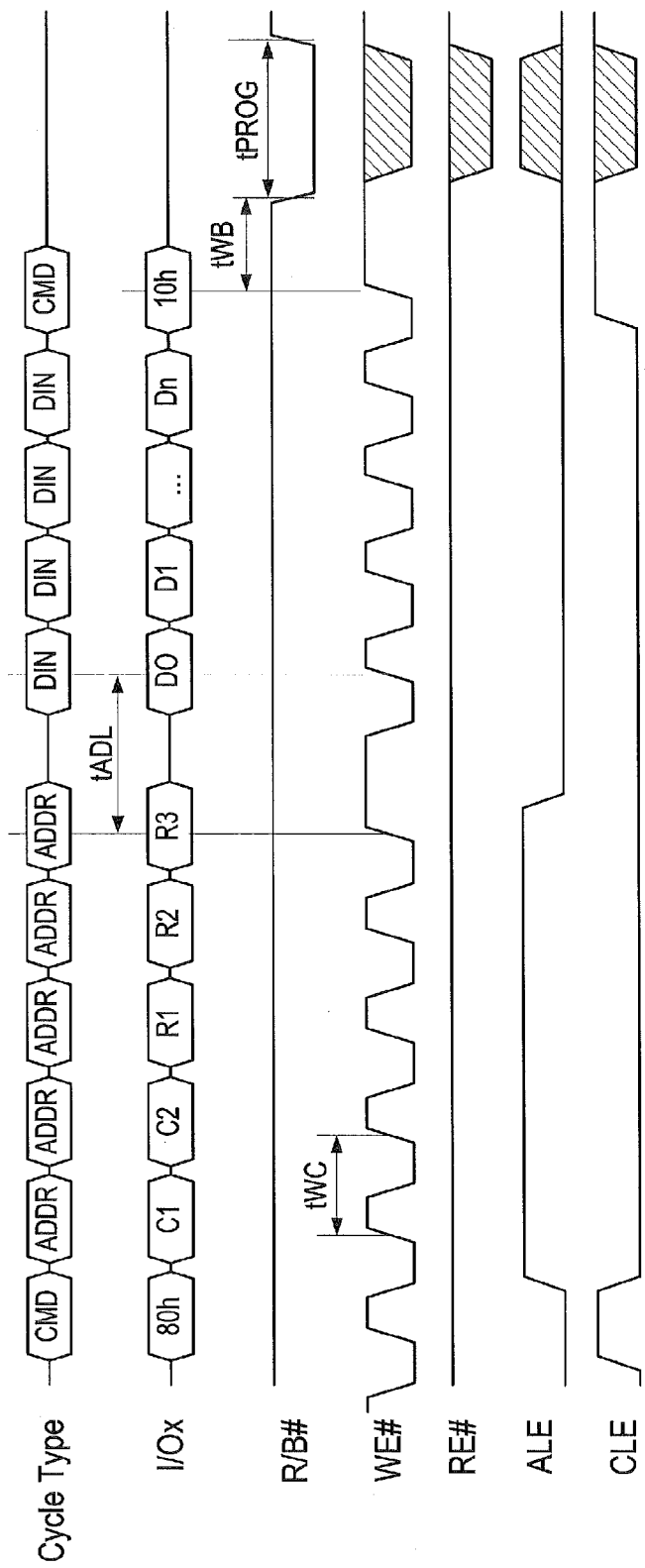
FIG. 2 illustrates a timing diagram 200 for a standard Open NAND Flash Interface (ONFI) page program command.
Figure 3:
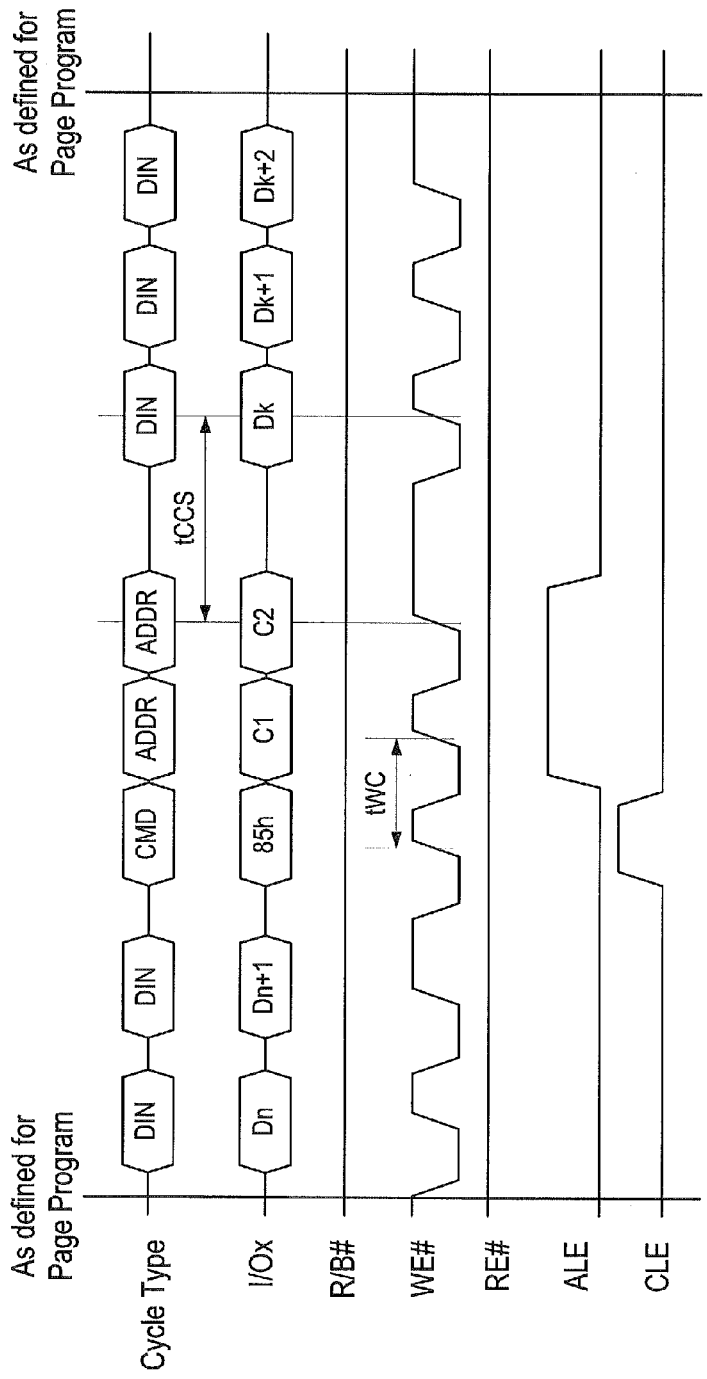
FIG. 3 illustrates a timing diagram 300 for a Change Write Column (CWC) command from the ONFI specification.

Referring now to the drawings, FIGS. 6-15 illustrate exemplary aspects of the present invention.

Figure 6:
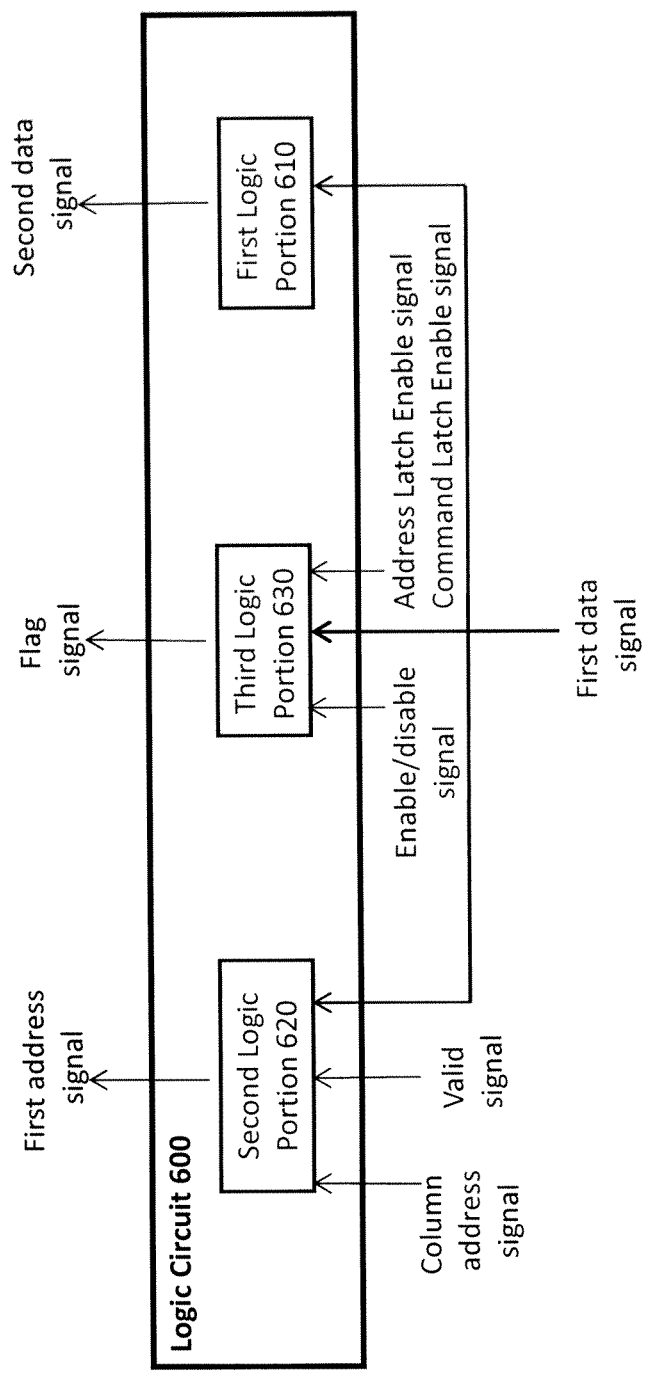
FIG. 6 illustrates a logic circuit 600 for a semiconductor memory device, according to an exemplary aspect of the present invention.

FIG. 6 illustrates a logic circuit 600 for a semiconductor memory device, according to an exemplary aspect of the present invention.

As illustrated in FIG. 6, the logic circuit 600 includes a first logic portion 610 which stores data from a first data signal, and generates a second data signal based on the first data signal, a second logic portion 620 which generates a first address signal and stores an address from the first address signal where data from the second data signal is to be written, and a third logic portion 630 which generates a flag signal which indicates whether the data stored in the first logic portion 620 is valid.

As further illustrated in FIG. 6, the first data signal may be input to the first, second and third logic portions 610, 620, 630, and a column address and a valid signal (e.g., a signal which asserts validity of a starting column address) may be input to the second logic portion 620. An enable/disable signal, an address latch enable signal and a command latch enable signal may also be input to the third logic portion 630.

Figure 7:
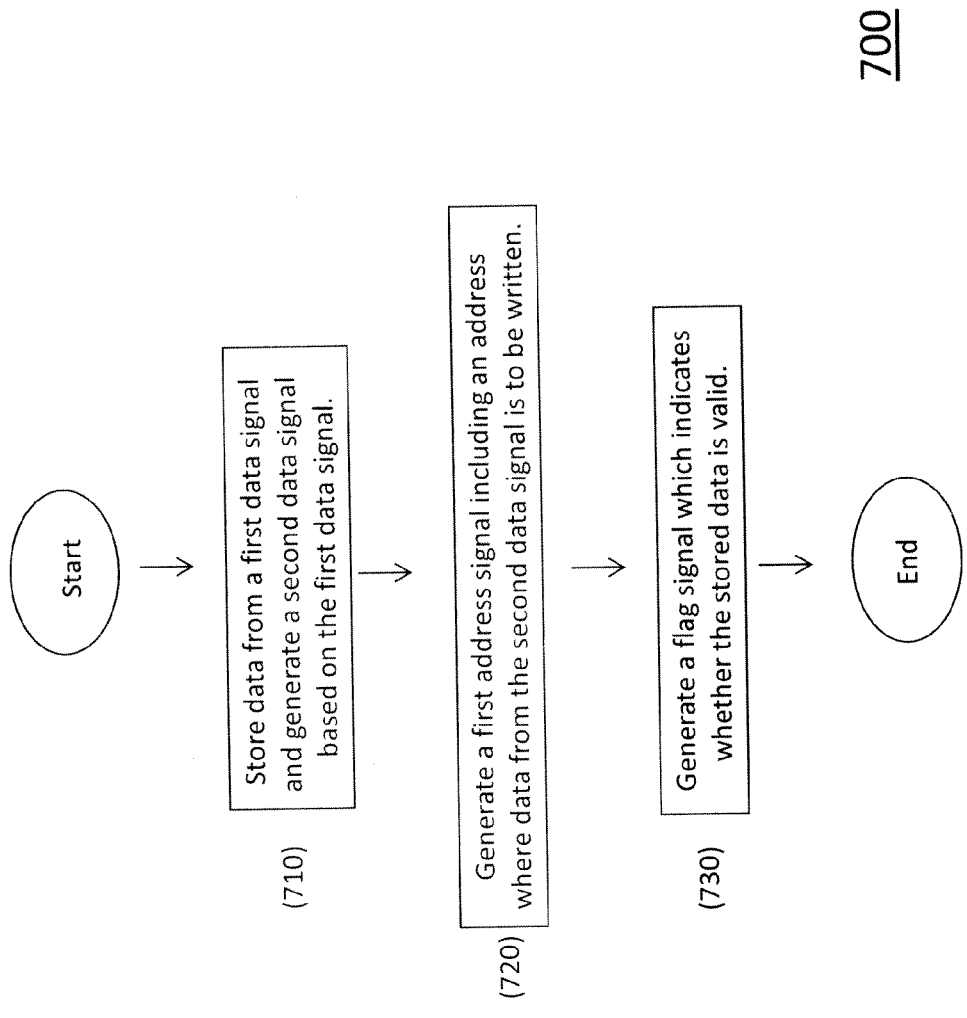
FIG. 7 illustrates a method 700 of managing an operation in a semiconductor memory device, according to an exemplary aspect of the present invention.

FIG. 7 illustrates a method 700 of managing an operation in a semiconductor memory device, according to an exemplary aspect of the present invention.

As illustrated in FIG. 7, the method 700 includes storing (710) data from a first data signal and generating a second data signal based on the first data signal, generating (720) a first address signal including an address where data from the second data signal is to be written, and generating (730) a flag signal which indicates whether the stored data is valid.

The exemplary aspects of the present invention may provide an efficient and effective implementation of data-in path architecture in a semiconductor memory device (e.g., NAND flash memory). In particular, the exemplary aspects of the present invention (e.g., an exemplary architecture) may provide a "bug free" management of all kinds of program commands, especially under certain conditions such as when aggressive time specifications are required.

An important idea of the exemplary aspects of the present invention is the introduction of a "flag bit" structure able both to adapt to the typical standard command set format and (e.g., at the same time) to permit logic minimization of a data-in entry path in order to match timing requirements of current memory specifications (e.g., NAND specifications) and future memory specifications.

The "flag bit" architecture in the exemplary aspects of the present invention may satisfy all existing flash memories operations interested in data entry such as page program, cache program, copyback program, interleaved (multiplane)

program, interleaved (multiplane) copyback program, interleaved (multiplane) cache program, change write column (Random data input).

Figure 8:
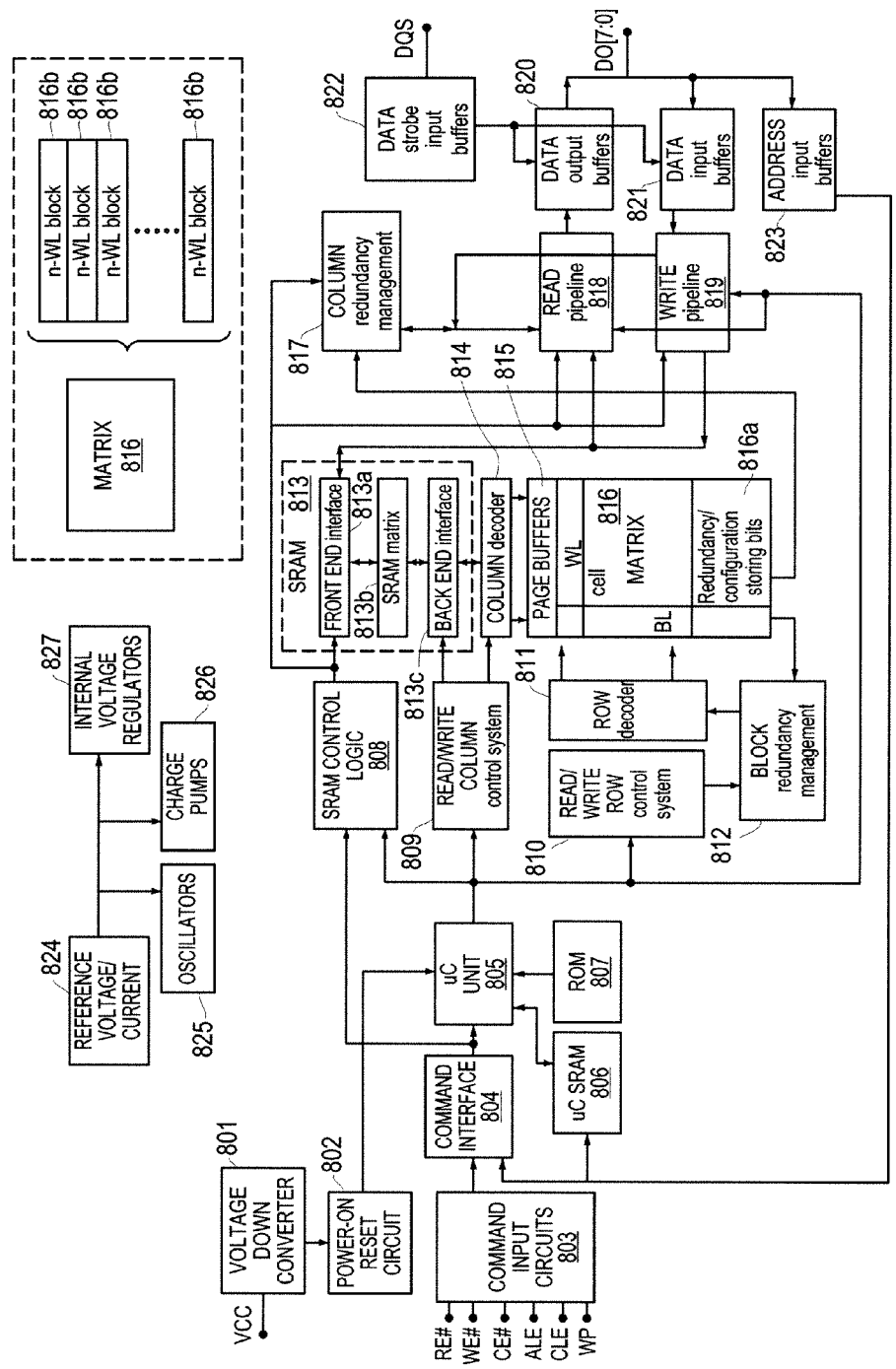
FIG. 8 illustrates a semiconductor memory device 800 (e.g., NAND architecture) according to an exemplary aspect of the present invention.

FIG. 8 illustrates a semiconductor memory device 800 (e.g., NAND architecture) according to an exemplary aspect of the present invention. It should be noted that the logic circuit 600 in FIG. 6 may be formed in write pipeline 819 of memory device 800 in FIG. 8.

As illustrated in FIG. 8, the memory device 800 includes a voltage down converter 801 which is connected to a power supply (VCC), and a power-on reset circuit 802. The device 800 also includes a command input circuit 803 which is coupled to synchronization pads for receiving a read enable signal (RE #), a write enable signal (WE #), and a chip enable signal (CE #), and is connected to control pads for receiving an address latch enable signal (ALE) and a command latch enable signal (CLE), and is connected to a pad for receiving a write protect signal (WP). The device also includes a command interface 804 which is connected to the command input circuit 803.

The command interface 804 and the power-on reset circuit 802 are connected to a microcontroller unit 805, and a microcontroller RAM 806 and ROM 807 are accessible by the microcontroller unit 805.

The device 800 includes SRAM control logic 808 which receives an output of the command interface 804 and the microcontroller unit 805, and also includes read/write column control system 809 and read/write row control system 810 which receive an output of the microcontroller unit 805.

The device 800 also includes row decoder 811, column decoder 814 and page buffers 815 which are connected to the matrix 816 (e.g., memory array). The memory array 816 includes redundancy/configuration storing bits 816a and a plurality of memory blocks 816b (e.g., n-WL blocks). The matrix 816 is also connected to block redundancy management 812 and column redundancy management 817.

The device 800 includes a read pipeline 818 which is connected to the column redundancy management 817 and the front end interface 813a of the SRAM 813, and receives an output of the SRAM control logic 808, and an output of the microcontroller unit 805. The device 800 also includes a write pipeline 819 which is connected to the front end interface 813a of the SRAM 813 and receives an output of the SRAM control logic 808 and an output of the microcontroller unit 805.

The device 800 also includes data output buffers 820 which receives data which is output of the read pipeline 818 and data input buffers 821 which inputs data to the write pipeline 819.

The device 800 also includes data strobe input buffers 822 which are connected to the data output buffers 820 and the data input buffers 821, and address input buffers 823 which input an address to the command interface 804 and the microcontroller SRAM 806. The data output buffers 820, data input buffers 821, data strobe input buffers 822 and address input buffers 823 are connected to data pads (DQ) for inputting data to the device 800 and outputting data from the device 800.

The device 800 also includes a reference voltage/current generator 824, and oscillators 825, charge pumps 826 and internal voltage regulators 827 which receive an output of the reference voltage/current generator 824.

As noted above, in recent memory devices (e.g., NAND devices), very aggressive timing specifications are required to minimize the duration of the data-in phase. As a consequence, the data-in path may need to assume a more complicated architecture which is able to work both for a fast tWC and to match aggressive setup and hold time for the validity of the data window.

In conventional memory devices, it has been difficult to design a structure (and method) able to manage fast writing cycles (a typical problem inside a digital design) and which does not require a changing of standardized format of commands. Thus, implementing such conventional devices raises the risks of "bugs" due to the changing of the standardized format of commands.

In some conventional memory devices, the management of entire command set format has always been in the charge of the command interface. This circuitry has to recognize commands, address and data cycles and has to drive all circuitries by providing well temporized signals in order to ensure a correct functionality. In particular, in this circuitry (e.g., data-in circuitry), the command interface must recognize setup/confirm commands, latch starting address, and provide address, data, control signals and clock to ensure loading into buffer only of correct information (e.g., data provided during data-in phase).

An important issue to consider is that the time to process information and to provide with appropriate temporizations all listed signals is very short, considering that command interface is a very complex state machine that has to process a very high number of possible commands (not only subset of possible program listed before).

Another important issue to consider is that when a pipeline has to be used, at the end of data loading not all data are already stored into the RAM and this implies that when the algorithm starts, some data must be shifted into RAM to empty pipeline path. This explains the reason of tIPBSY (e.g., the time between two branches of multiplane commands) shown in the timing diagram 500 of FIG. 5. In conventional devices, tIPBSY is a time to run an algorithm or a logic that has to empty a left side pipeline path into a left RAM before starting the loading on the right side.

That is, in conventional memory specifications which are not characterized by aggressive clocks, it is possible to write data directly into page buffers in "real time". After a first step of evolution in timing specifications, it was needed to introduce a RAM to store data in "real time" and only during an algorithm was the content transferred into page buffers. Inserting "real time" data means that for each cycle of the write enable signal WE # (in proper phase), data provided on the IO pads are stored into the RAM. This has been possible in conventional devices because the setup of data and WE # minimum cycle (tWC) were compatible with the path between pads and RAM.

However, in current flash memory specifications (e.g., ONFI), due to aggressive timing requirements, this situation is no longer possible. Thus, one or more levels of registers were introduced and represent a pipeline that allows data to be saved into registers in real time, without storing the data into RAM.

More precisely, each cycle of the write enable signal WE # allows current data to be stored into a register and can be used to shift a previous valid data from a register to the RAM. This implies that when a user provides last data, the last data will not enter RAM but will be stored into a register of the pipeline. At this point, depending on the number of registers in the pipeline, it may be necessary to transfer register data into RAM before starting the program algorithm.

It should be noted that the term "algorithm" may refer to an operation that is performed after a data entry phase (e.g., after a data-in operation). The clock used in the algorithm phase is an internal and "relaxed" clock, so processing of data is not critical in the algorithm phase. However, it is important to ensure a correct storing of data depending on a critical (tWC) external clock (WE #), and this may be provided by the present invention. That is, the present invention may help to ensure the integrity of data stored in the RAM even when system clock is aggressive and a pipeline is needed. Once this has been ensured, the use of the data is typically the transferring of them into page buffers for the program algorithm.

It should be noted that if the NAND device is organized in more than two planes, efficiency of the multipage program may be enhanced. An exemplary aspect of the present invention is described herein based on a two plane memory device (e.g., a dual plane NAND device described herein as having a "left side" and a "right side") for ease of explanation. However, the present invention is by no means limited to a two plane device, but may be equally applicable to a device (e.g., an architecture) having more than two planes.

An object of an exemplary aspect of the present invention is not only to solve logic and timing data-in issues in a specified memory device (e.g., NAND device), but also to suggest a more general idea both to 1) approach an argument in all existing cases of program commands, and 2) to guarantee that flexibility to be extended to implementing new features.

Figure 9:
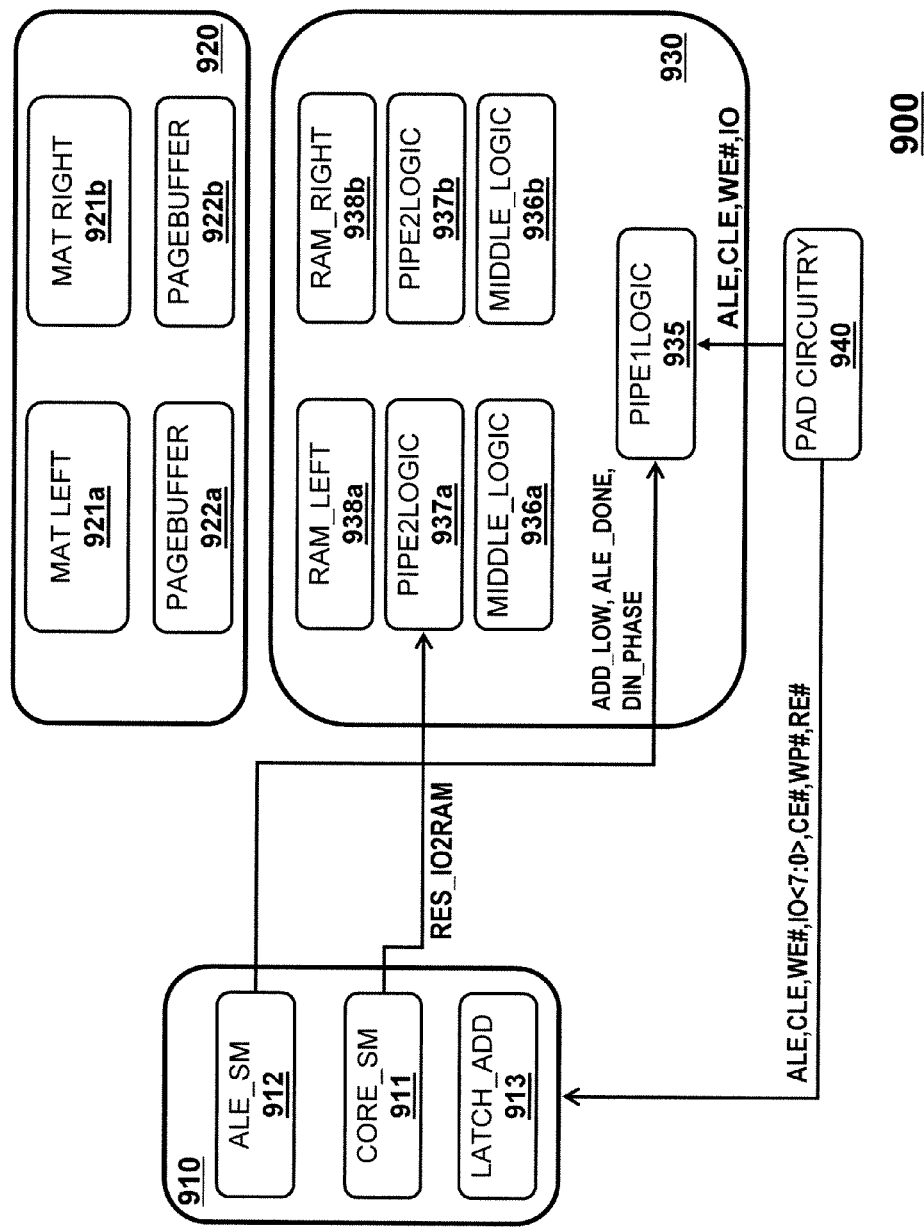
FIG. 9 illustrates a data-in architecture 900 for a semiconductor memory device, according to an exemplary aspect of the present invention.

FIG. 9 illustrates a data-in architecture 900 for a semiconductor memory device, according to an exemplary aspect of the present invention. It should be noted that the command interface 804, the memory array 816, and the write pipeline 819 (including the logic circuit 600 in FIG. 6) in FIG. 8 may correspond respectively to command interface 910, and memory array 920, and logic 930 in FIG. 9.

In particular, FIG. 9 illustrates a block scheme which points out some important blocks involved in the exemplary aspects of the present invention.

As illustrated in FIG. 9, the data-in architecture 900 includes a command interface 910, a memory array 920 (e.g., matrix and page buffer), and a logic circuit 930.

The command interface 910 includes a first circuit 911 (CORE_SM), a second circuit 912 (ALE_SM), and a third circuit 913 (LATCH_ADD).

The first circuit 911 (CORE_SM) is the circuitry "owner" of command recognition. That is, the first circuit 911 establishes whether a command, provided by the command latch enable signal CLE and the data signal IO, corresponds to the setup or confirm of one of the possible operations, and checks to determine whether the format of a sequence is correct. In addition, the first circuit 911 has the task to switch on, at the right time, circuitry responsible of other operations.

The second circuit 912 (ALE_SM) includes a state machine that handles the storing of addresses inserted after the setup commands. A stored address represents the starting address for a "data-in" operation. Depending on the kind of command, a valid address is made by two bytes (CWC), five bytes (page program) and so on.

After command setup, the valid signal (ALE_DONE) goes to a first level (e.g., a low level), and when the entire address is loaded, then the valid signal switches to a second level (e.g., a high level). Thus, only after this last transition, is the starting address of the data-in operation valid and the data-in phase can start.

The third circuit 913 (LATCH_ADD) includes a plurality of latches in which addresses, provided inside proper command format, are stored. As addresses are provided on a byte basis, the plurality of latches is organized in five banks of eight latches each. An enabling of these banks is managed by the second circuit 912.

An output of the third circuit 913 is organized in parts (e.g., two signals). A row address signal ADD_HIGH represents the address of page to be programmed. The information in the row address signal will be used during algorithm phase and corresponds to byte R3,R2,R1 shown in specification figures (e.g., ONFI specifications). A column address signal ADD_LOW represents the starting address of data-in phase and corresponds to byte C2,C1. The information in the column address signal will be used in the logic circuit 930 (DATAIN_LOGIC).

Referring again to FIG. 9, the logic circuit 930 includes two planes which are identified by the letter "a" (i.e., left plane) and the letter "b" (i.e., right plane). In particular, the logic circuit 930 includes RAM 938a, 938b, second pipeline logic 937a, 937b, middle logic 936a, 936b, and first pipeline logic 935. The logic circuit 930 will be described in more detail below.

Figure 11:
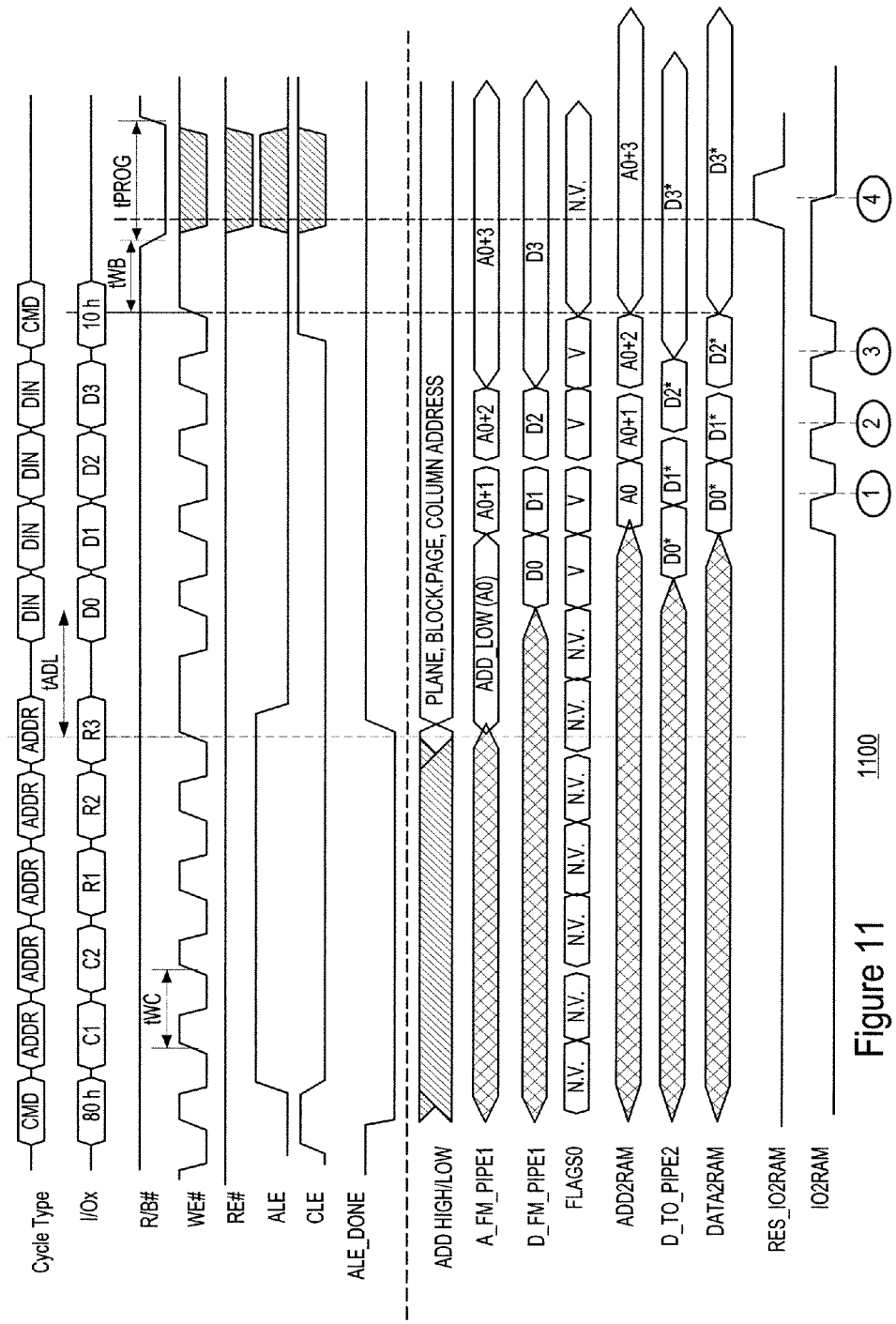
FIG. 11 illustrates a timing diagram 1100 for a standard page program, according to an exemplary aspect of the present invention.

The RAM 938a, 938b (e.g., SRAM 813 in the device 800 of FIG. 8) includes a buffer where bytes (e.g., all bytes) are stored before an algorithm. As illustrated in FIG. 11 (described below), after confirm command, the algorithm starts and the content of the RAM 938a, 938b is shifted into the page buffers 922a, 922b (e.g., page buffers 815 in the device 800 of FIG. 8).

Since the page buffers 922a, 922b in a memory device (e.g., NAND flash memory), may have a particular "area optimized" structure, bytes cannot be loaded directly into the page buffers 922a, 922b when aggressive data-in timing is required. In addition, as a page size may include thousands of bytes, an array of standard latches would be inconvenient.

Typically, in a multiplane device there is a RAM for each plane. In an exemplary aspect of the present invention, the RAM 938a, 938b includes a dual RAM interface and has a pin-out on front end side associated with a data-in phase and a pin-out on the back end side associated with an algorithm phase (e.g., data transfer to the page buffers 922a, 922b).

An exemplary aspect of the present invention may involve primarily the front end side of the RAM interface (e.g., front end interface 813a of SRAM 813 in the device 800 of FIG. 8). Enablement of the front end side may be controlled by the control signal FE_EN. That is, when the control signal FE_EN is at a first level (e.g., a high level) it is possible to read/write data in the memory device.

Referring again to FIG. 9, the memory array 920 includes matrices 921a, 921b and page buffers 922a, 922b.

The page buffers 922a, 922b are customized latches in which the content of the RAM 938a, 938b is shifted during a first phase of a program algorithm. The matrices 921a, 921b is an array of non-volatile cells organized in planes, blocks and pages.

The circuitry of the logic circuit 930 is an important feature of an exemplary aspect of the present invention. The logic circuit 930 is responsible for handling the transfer of valid data (e.g., only valid data) into the RAMs 938a, 938b during all kind of program commands. The circuit 930 may require only a very low number of signals by the command interface, and may only need to be enabled (after setup command), disabled (after confirm) and initialized (starting column address).

As illustrated in FIG. 9, some signals such as the signal RES_IO2RAM (a signal used only to end writing of last data when an algorithm starts), the column address signal ADD_LOW, the enable/disable signal DIN_PHASE, and the valid signal ALE_DONE (e.g., a signal which asserts a validity of a starting column address) may be input to the logic circuit 930 from the command interface 910. Other signals (e.g., ALE, CLE, WE #, IO) may enter the logic circuit 930 directly by a pad such as pad circuitry 940.

Figure 10:
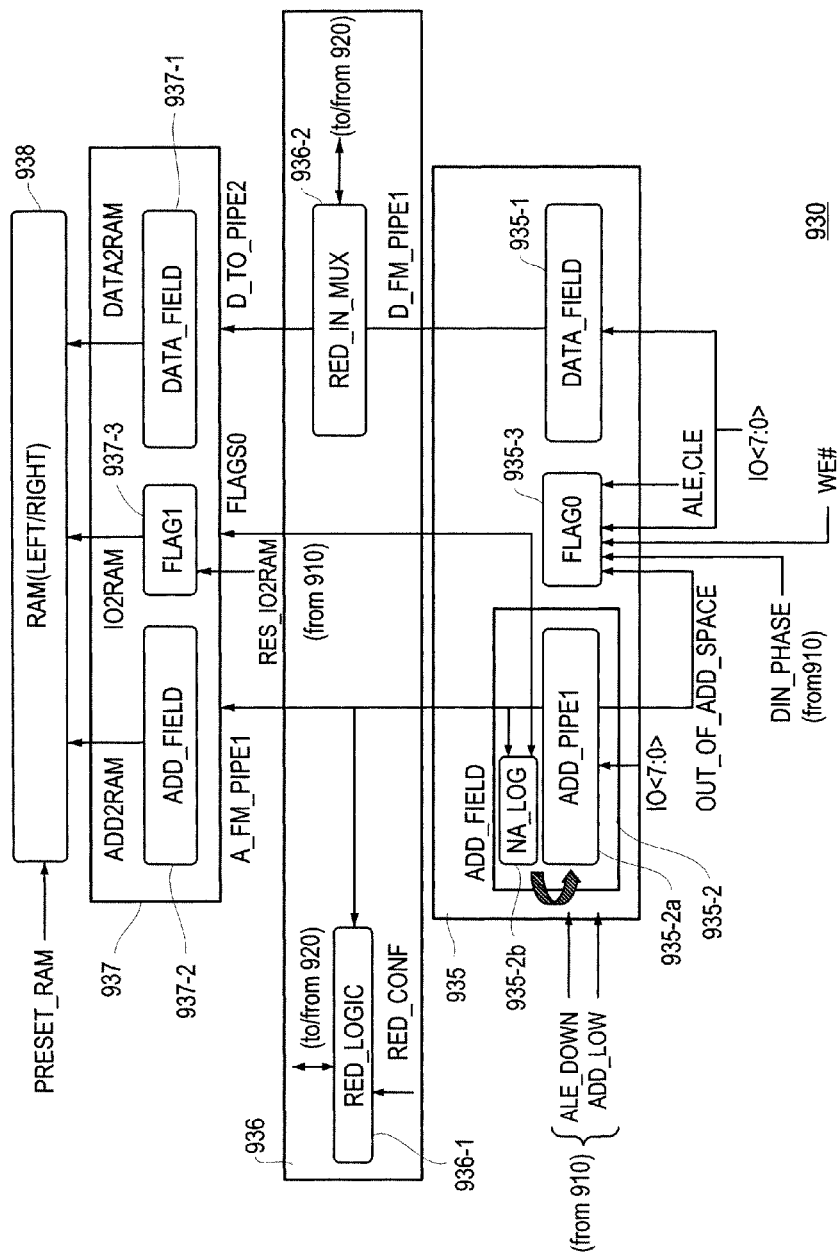
FIG. 10 provides a more detailed illustration of the logic circuit 930 (DATA-IN LOGIC), according to an exemplary aspect of the present invention.

FIG. 10 provides a more detailed illustration of the logic circuit 930 (DATA-IN LOGIC), according to an exemplary aspect of the present invention. For simplicity, only one plane of the RAM 938, second pipeline logic 937 (PIPE2LOGIC)

and middle logic 936 (MIDDLE_LOGIC) are illustrated in FIG. 11. That is, in a multiplane device, the logic circuit 930 would include a RAM 938, second pipeline logic 937 and middle logic 936 for every plane (e.g., as illustrated in FIG. 9).

It should be noted that the signals and data being input to and output from the RAM 938, second pipeline logic 937 and middle logic 936 illustrated in FIG. 11, would be applicable to each plane in a multiplane device.

As illustrated in FIG. 11, a plurality of signals including the valid signal ALE_DONE, the column address signal ADD_LOW and the enable/disable signal DIN_PHASE are input to first pipeline logic 935 from the command interface 910, and the signal RES_IO2RAM is input to the second pipeline logic 937 from the command interface 910 (e.g., as also illustrated in FIG. 9). Other signals such as the address latch enable signal ALE, the command latch enable signal CLE, the data signal IO and the write enable signal WE #, may be input to the first pipeline logic 935 from pad circuitry 940. Some other signals such as the signal RED_CONF may be input to middle logic 936 from pad circuitry 940, and other signals such as the signal PRESET_RAM may be input to the RAM 938 from pad circuitry 940.

The first pipeline logic 935 is common to all planes in a multiplane device. Just to minimize paths of critical signals from pad circuitry 940, the layout position of the first pipeline logic 935 may be positioned close to pad circuitry 940. That is, of all of the blocks in the logic circuit 930, the first pipeline logic 935 has the least physical distance to the pad circuitry 940, which may help to make it possible to better manage aggressive setup/hold timing of data signal (IO) and control signals (e.g., ALE, CLE).

The first pipeline logic 935 may be organized into three circuitries: a data field 935-1 (DATA_FIELD), an address field 935-1 (ADD_FIELD) and a flag field 935-3 (FLAG0).

The data field 935-1 may include a storage device such as a plurality of flip flops for storing data provided by a user. Even if the flip flops are part of the data-in path, to be sure not to lose valid data, data (e.g., IOs) may be stored independently depending on whether the data are associated with valid data or invalid data. That is, in data field 935-1, the valid data may be stored separate and apart from invalid data.

Data is defined valid if the RAM 938 is the correct destination for the data, and data is defined as invalid if the RAM 938 is not the correct destination for the data. The input to the data field 935-1 (e.g., the input to the flip flops) includes the data signal IO<7:0>, and the output from the data field 935-1 (e.g., the output from the flip flops) includes the data signal D_FM_PIPE1.

The address field 935-2 may include a storage device 935-2a (ADD_PIPE1) including a plurality of flip flops for storing an address from the address signal A_FM_PIPE1 where associated data in the data signal D_FM_PIPE1 is to be written (if the data is valid data). The address field 935-2 may also include a log 935-2b (NA_LOG) which may also include a combinatorial logic able to define next valid address. The address signal A_FM_PIPE1 may be initialized at the column address signal ADD_LOW when the valid signal ALE_DONE goes to a first level (e.g., a high level) and when the enable/disable signal DIN_PHASE goes to the first level. After initialization, the log 935-2b (NA_LOG) provides sequential addresses associated to the next data entering the data field 935-1 (DATA_FIELD).

In the drawings, valid data is identified by "V", and invalid data is identified by "N.V." If invalid data enters the data field 935-1 (DATA_FIELD), the address into the address field 935-2 (ADD_FIELD) is not incremented. This may help to avoid a situation where a spurious invalid data (e.g., an ALE cycle) inside data-in phase, would determine an incorrect address associated to the next valid data.

It should be noted that, in case of spurious ALE cycles inside a data-in phase, a specification (e.g., the ONFI specification) may require that the ALE cycles are ignored and that the program command evolution is not altered.

The flag field 935-3 (FLAG0) includes a storage device such as a flip flop (e.g., a single flip flop) with a minimum logic on its input. The flag field 935-3 includes a simple circuitry having as a task to "flag" if data stored into the data field 935-1 (DATA_FIELD) is valid or not. A data is valid if, on an edge of the write enable signal WE # (e.g., the rising edge of WE #), the following conditions are true: 1) the enable/disable signal DIN_PHASE is high (indicating data-in phase is active), 2) the address latch enable signal ALE is low (indicating that data in the data signal IO do not refer to an address cycle), and 3) the command latch enable signal CLE is low (indicating that data in the data signal IO do not refer to a command cycle).

If the output of the flag field 935-3 is a first value (e.g., "1"), then the data associated with that output (i.e., the data latched into the data field 935-1) is valid. This implies that the associated data will be written (on the appropriate cycle of the write enable signal WE #) into the RAM 938 at the associated address stored into the address field 935-2.

It should be noted that the present invention is not limited to an operation on a rising edge of the write enable signal WE #. That is, the architecture of the present invention is valid also for a falling edge approach.

The middle logic 936 (there is one for each plane of a multiplane program) processes data to evaluate if one or more bits have to be redunded (since are associated to a defective (e.g., broken) column location). It is significant to consider middle logic to justify the necessity of a further pipeline level before reaching RAM.

The middle logic 936 includes redundancy logic 936-1 (RED_LOGIC) which is communicatively coupled to memory array 920, and redundancy multiplexer 936-2 (RED_IN_MUX) which is also communicatively coupled to memory array 920.

The middle logic 936 uses the redundancy logic 936-1 to compare the current address in the address signal A_FM_PIPE1 to a list of addresses from the address list signal RED_CONF to determine if a bit in the current byte is associated with a defective (e.g., broken) location of the matrix 921. If the bit is defective, then the bit on the defective (e.g., failed) location is put at "1" by the redundancy multiplexer 936-2 (RED_IN_MUX) to avoid programming on defective columns.

After this processing, the redundancy multiplexer 936-2 outputs the data signal D_TO_PIPE2. If a bit which is stored in the data signal D_FM_PIPE1, is replaced by "1" after redundancy processing, then the bit will be managed by another part of circuitry which is not described because it is not necessary to understanding the present invention.

After redundancy processing, the data signal D_FM_PIPE1 becomes the data signal D_TO_PIPE2 which is a data signal that is ready for second pipeline logic 937 (PIPE 2_LOGIC).

The second pipeline logic 937 (there is a second pipeline logic 937 for each plane), may be placed physically close to the RAM 938 in order to help guarantee the best possible setup/hold timing of data and address in the writing operations to the RAM 938.

The second pipeline logic 937 (e.g., second pipeline level) may also be organized into three fields or circuitries: the data field 937-1 (DATA_FIELD), the address field 937-2 (ADD_FIELD) and the flag field 937-3 (FLAG1).

The data field 937-1 includes a storage device such as a plurality of flip flops storing data from the data signal D_TO_PIPE2 from the middle logic 936 and provides this information to RAM 938 via the data signal DATA2RAM. In addition, in the second pipeline logic 937, not only are valid data stored in the data field 937-1, but when data enters the first pipeline logic 935 (on an edge (e.g., a rising edge) of WE #), the previous data shift to the data field 937-1 (after processing of the data by the middle logic 936). Since not all data are valid at the first pipeline logic 935, not all data at the second pipeline logic 937 have to be written into the RAM 938.

Thus, for example, every time a rising edge of the write enable signal WE # occurs, the data stored in the data field 935-1 (and processed by the redundancy multiplexer 936-2) enters the data field 937-1 of the second pipeline logic 937. That is, the "shift" is from data field 935-1 to data field 937-1. For example, data entering the data field 937-1 at the edge "K" of the write enable signal WE # is the data entered in data field 935-1 at the edge "K−1" of the write enable signal WE #.

The address field 937-2 includes a storage device such as a plurality of realized by flip flops storing an address associated with data in the data signal DATA2RAM. The stored address is output to the RAM 938 in the address signal ADD2RAM which is a simple delayed copy of the address signal A_FM_PIPE1 in a shift register configuration. The logic evaluation of the address (initialization and counting) is managed at the first pipeline logic 935, so the second pipeline logic 937 has only to ensure that the aligning between the data (e.g., in the data signal DATA2RAM) and the address (e.g., in the address signal ADD2RAM) will be written into the RAM 938.

The flag field 937-3 (FLAG1) receives the flag signal FLAGS0 from the flag field 935-3 (FLAG0) in the first pipeline logic 935, and determines whether data from the data signal DATA2RAM which is stored in the data field 937-1 should be written at the address in the address signal ADD2RAM. When an edge (e.g., a rising edge) of the write enable signal WE # occurs (independently if it is provided for an address, a command or a data), an output of the signal IO2RAM goes to a first level (e.g., high) if the flag signal FLAGS0 is at the first level (e.g., high). This may put RAM 938 in a write configuration.

Effective writing of information happens on the next edge of the write enable signal WE # (e.g., the next falling edge of WE #) that resets the signal IO2RAM. This ensures that sequential writing can be managed and that the data signal DATA2RAM and the address signal ADD2RAM are valid for the time Twel (e.g., a setup period) and Tweh (e.g., a hold period). These values are guaranteed by specification.

On the contrary, if the input flag signal FLAGS0 is at a second level (e.g., low) when an edge of the write enable signal WE # occurs (e.g., when a rising edge of WE # occurs), the signal IO2RAM remains at the second level (e.g., low) and no writing will occur on the next edge of WE #(e.g., the next falling edge of WE #).

The flag field 937-3 also receives a signal RES_IO2RAM which is a signal used to end writing of the last data when an algorithm starts. This is clear in FIG. 11 (described below) which represents a standard page program. When the last cycle of the write enable signal WE # occurs (for confirm command), the signal IO2RAM goes to a first level (e.g., high) to set the RAM 938 for writing of the last data. The specification (e.g., ONFI) does not guarantee a following edge of the write enable signal WE # (e.g., a following falling edge) to terminate this writing. For this reason, the second circuit 911 CORE_SM generates the signal RES_IO2RAM so that the last writing occurs (e.g., see FIG. 9). In other situations, if an edge (e.g., a falling edge) has been provided by a user causing the end of writing, then the signal RES_IO2RAM is asserted but has no effect.

FIGS. 11-14 illustrate timing diagrams which describe behavior of the signals shown in FIG. 10 in different situations. In FIGS. 11-14, the effective writing edges are identified by the numbers "1","2", "3" and "4".

It should be noted that in FIGS. 11-14, the signal IO2RAM determines synchronization of write operations, the signal ADD2RAM is an address signal, and the data signal DATA2RAM is the RAM data-in bus. Other pins are not described herein because it is not necessary to the understanding of the present invention.

In particular, FIG. 11 illustrates a timing diagram 1100 for a standard page program, according to an exemplary aspect of the present invention.

That is, FIG. 11 shows an example of a standard page program in which four (4) valid data are provided in the sequence. As noted above, the numbers "1","2", "3" and "4", identify the edges when data D0, D1, D2 and D3 enters the RAM, respectively. That is, the number "1" is identifies the edge of the write enable signal WE # at which the first data D0 provided to the flash enters RAM (e.g., RAM 938), the number "2" identifies the edge of the write enable signal WE # at which the second data D1 enters the RAM and so on.

As illustrated in FIG. 11, in an implementation of the present invention, each valid data enters RAM with a delay of two (2) and one-half cycles of the write enable signal WE #. As also illustrated in FIG. 11, when an edge (e.g., a rising edge) of the write enable signal WE # occurs, an output of the signal IO2RAM goes to the first level (e.g., high) if the flag signal FLAGS0 is at the first level (e.g., high). Further, when the signal IO2RAM goes to the first level (e.g., a high level), the RAM decoding logic of the writing path is switched "on", but only on an edge of the signal IO2RAM (e.g., the IO2RAM falling edge), and the data in the data signal DATA2RAM are effectively written at the specified address.

Figure 12:
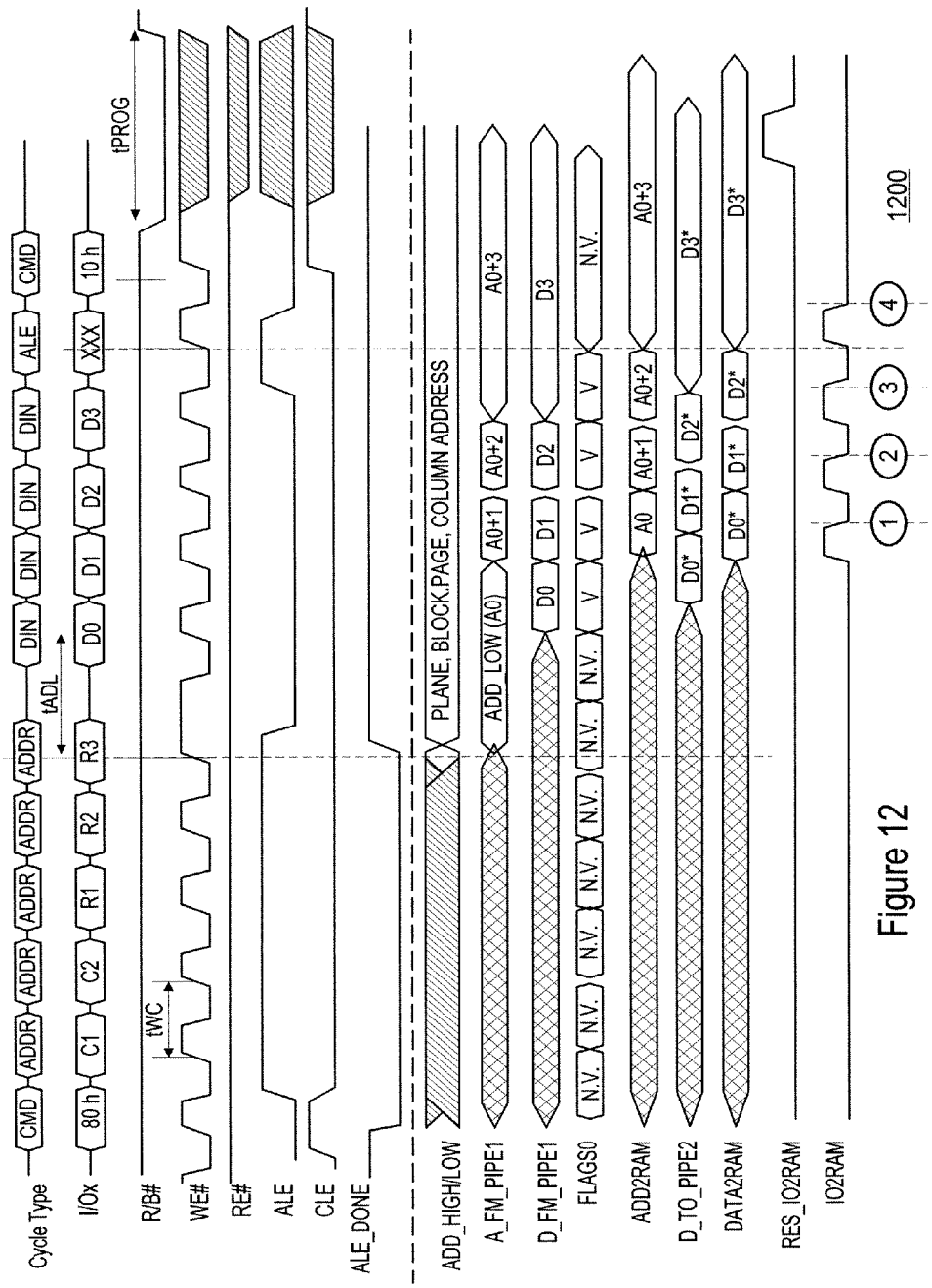
FIG. 12 illustrates a timing diagram 1200 for a page program with a dummy (e.g., spurious) ALE cycle before confirm, according to an exemplary aspect of the present invention.

FIG. 12 illustrates a timing diagram 1200 for a page program with a dummy (e.g., spurious) ALE cycle before confirm, according to an exemplary aspect of the present invention. As in FIG. 11, in FIG. 12 the numbers "1","2", "3" and "4", identify the edges when data D0, D1, D2 and D3 enters the RAM, respectively.

A spurious ALE situation is difficult to manage with conventional devices. Current specifications (e.g., ONFI) specify to ignore data associated with an ALE cycle in "data in" phase but not to interrupt the sequence, since no previous or future valid data has to be lost.

A spurious CLE may also occur and, following the NAND specifications, the command interface breaks the entire sequence, and typically the data loaded before the spurious CLE can be lost and are no more significant. The present invention (e.g., the flag logic) may also be applicable in this situation which is not provided by NAND specifications. In particular, the present invention may mark data as "invalid" data associated with CLE cycles and preserve the previous data inserted. Thus, if there are some applications where data stored into RAM are used subsequently at one or more "invalid" CLE cycles, the approach of the present invention can be useful.

The flag logic of the present invention (e.g., flag field 935-3) may also be used in other situations. For example, in a program command (or after a Change Write Column) an address is provided, and this address represents the RAM location where first data provided by the host must be stored, and next data are stored into sequential addresses. The logic addressing space of a NAND protocol is wider than the physical used address space.

For example, a 2 KB page sized flash has associated 13 address bits in column address to permit also addressing of spare area. However 13 address bits corresponds to a logical RAM space of 4096 bytes, but the physical space of a standard 2 KB page size ram is 2112 bytes (2048 main +64 spare).

This means that if the "real" address space is overcome, then the data provided does not need to enter RAM, but the sequence does not need to be interrupted. The flag field 935-3 of the present invention may mark as "invalid" all data out of real addressing space. If a CWC is used to re-enter "real" addressing space, then the flag field 935-3 of the present invention is able to mark next data as "valid". Such a situation is indicated in FIG. 10 by the signal OUT_OF_ADD_SPACE exiting from the address field 935-2 and entering the flag field 935-3.

Figure 13:
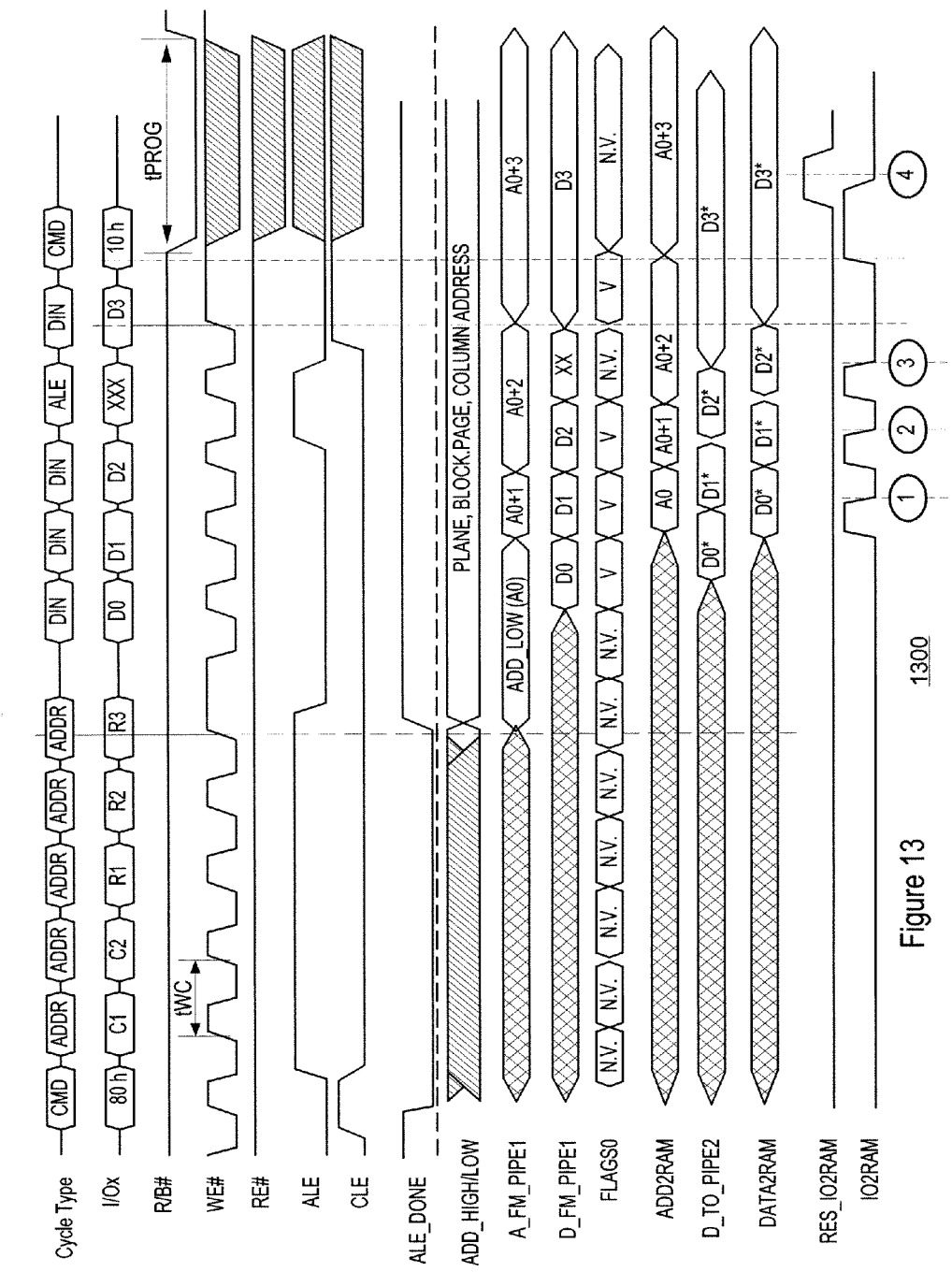
FIG. 13 illustrates a timing diagram 1300 for page program with a dummy ALE cycle during data-in, according to an exemplary aspect of the present invention.

FIG. 13 illustrates a timing diagram 1300 for page program with a dummy ALE cycle during data-in, according to an exemplary aspect of the present invention. As in FIGS. 11 and 12, in FIG. 13 the numbers "1","2", "3" and "4", identify the edges when data D0, D1, D2 and D3 enters the RAM, respectively.

Figure 14:
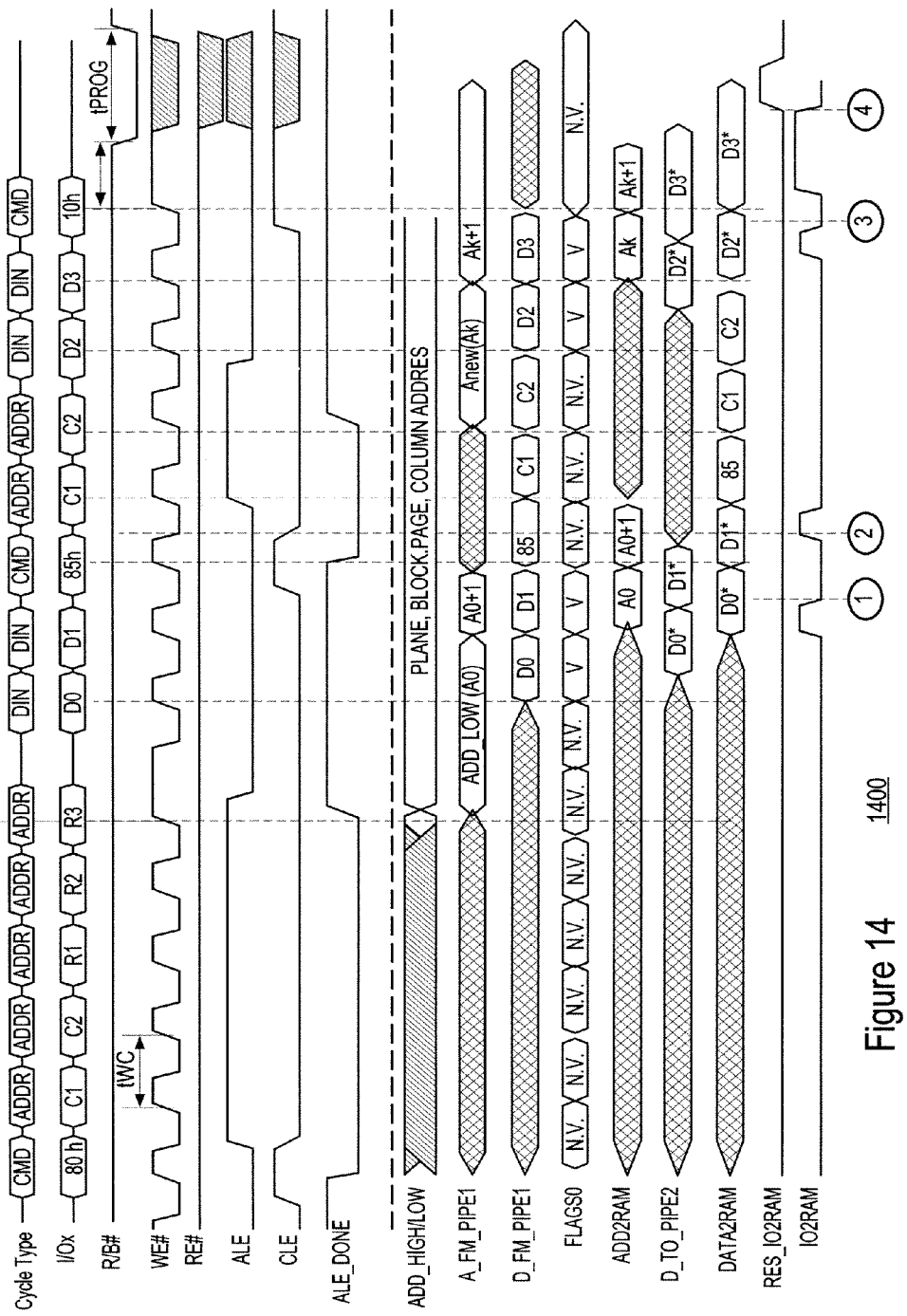
FIG. 14 illustrates a timing diagram 1400 for page program with a nested CWC, according to an exemplary aspect of the present invention.

FIG. 14 illustrates a timing diagram 1400 for page program with a nested CWC, according to an exemplary aspect of the present invention. As in FIGS. 11-13, in FIG. 14 the numbers "1","2", "3" and "4", identify the edges when data D0, D1, D2 and D3 enters the RAM, respectively.

Similar to FIG. 11, in FIGS. 12-14, when an edge (e.g., a rising edge) of the write enable signal WE # occurs, an output of the signal IO2RAM goes to the first level (e.g., high) if the flag signal FLAGS0 is at the first level (e.g., high). Further, when the signal IO2RAM goes to the first level (e.g., a high level), the RAM decoding logic of the writing path is switched "on", but only on an edge of the signal IO2RAM (e.g., the IO2RAM falling edge), and the data in the data signal DATA2RAM are effectively written at the specified address.

It should be noted that in FIGS. 11-14, the rising edge of signal RES_IO2RAM should happen close to the falling edge of the ready/busy signal R/B # as it determines writing, if needed, of the last data into the RAM (e.g., RAM 928 in FIG. 9). This operation may happen at the beginning of the program algorithm phase and before data transfer from RAM to PB (e.g., from RAM 938 to page buffer 922 in FIG. 9). This feature is illustrated, for example, in FIG. 14.

Thus, as illustrated, for example, in FIG. 14, an exemplary aspect of the present invention may include the sequence: rising edge of WE # for confirm ->R/B # falling edge ->RES_IO2RAM rising edge->RES_IO2RAM falling edge ->after a long period (e.g., 100 μsec to 150 μsec) R/B # rising edge.

The present invention may also be applicable to many other situations in additions to the situations described above (e.g., in FIGS. 11-14). In particular, the copyback program is managed at the same way of a page program (same command format). When a multiplane operation occurs before starting of second data-in entry phase, the entire pipeline of left side has been written into RAM (e.g., RAM 938).

The proposed architecture of the present invention not only faces and solves logic and timing data-in issues in a specified NAND device but may suggest a more general idea to approach different cases of program commands. The "flag bit" architecture (e.g., flag field 935-3, flag field 937-3 etc.) of the present invention provides flexibility to be extended to new features will be introduced in the future.

Figure 4:
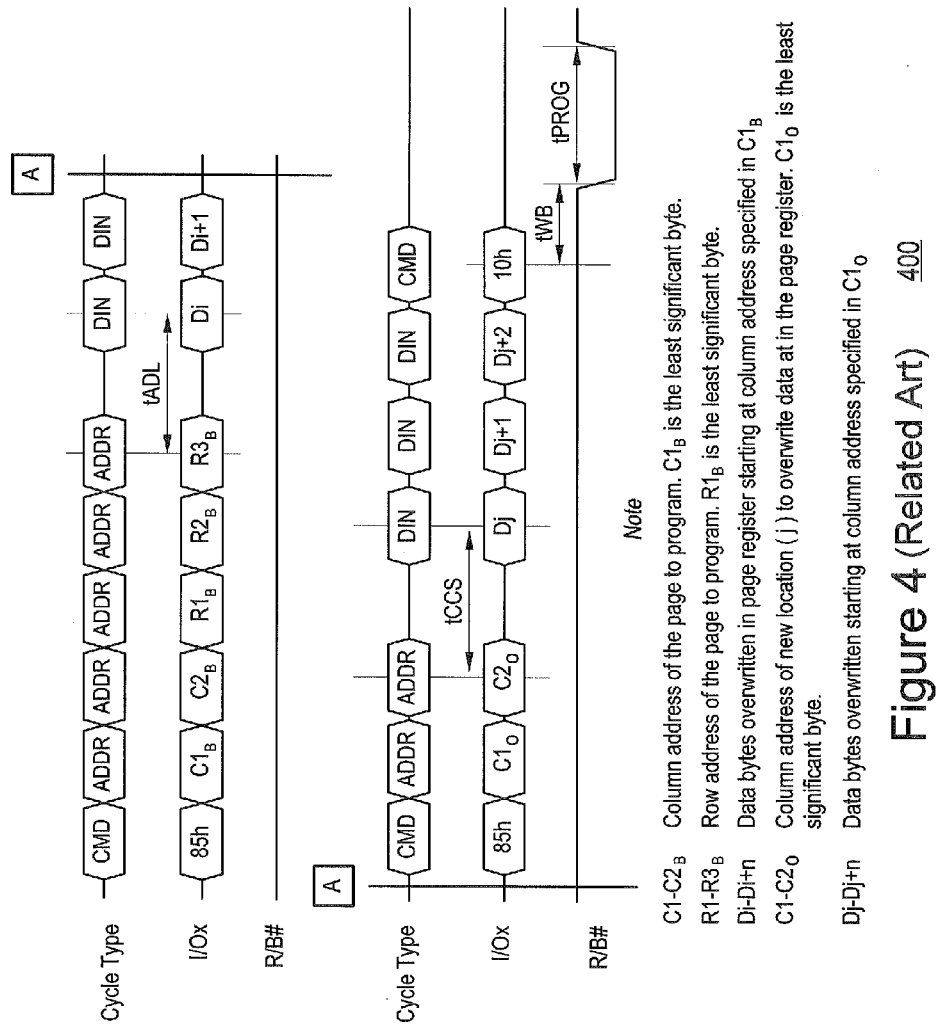
FIG. 4 illustrates a timing diagram 400 for a Copy-back program with CWC.
Figure 5:
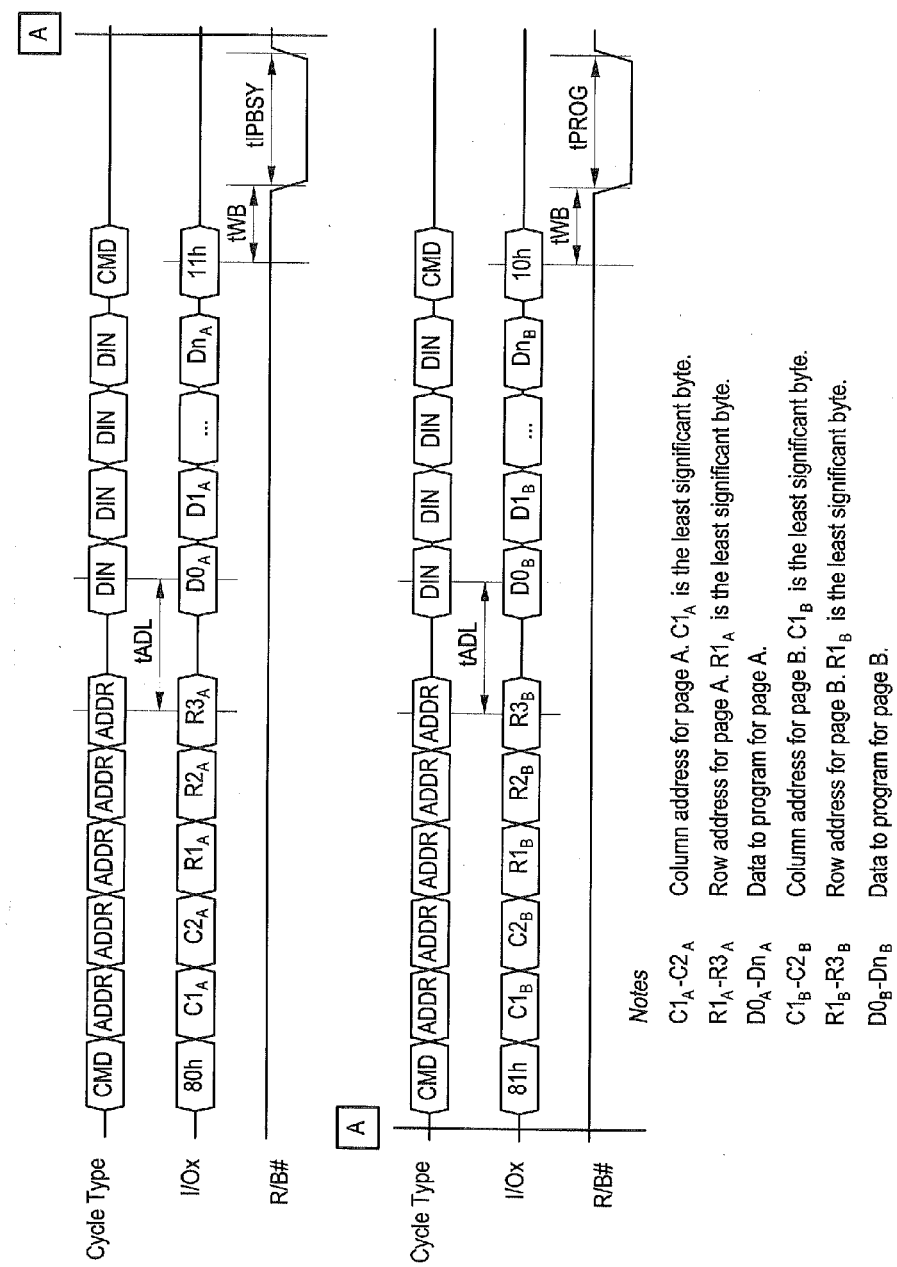
FIG. 5 illustrates a timing diagram 500 for a multiplane (e.g., interleaved) page program or a multiplane copy-back program.

In addition, the present invention may work without the necessity of some timing parameters introduced by specifications (e.g., ONFI) in order to facilitate design implementation (tIPBSY, tADL in FIG. 5, tCCS in FIG. 4).

In conventional devices, tIPBSY is used to handle (e.g., in some countries) the end of writing of left plane buffer in the middle of a multi-plane program. tIPBSY is the time between two phases of an interleaved operation. Conventionally, this time is required because when a pipeline is used, at the end of the "left side" data in phase (e.g., loading of the last data), not all of the data are already stored into the left RAM (e.g., RAM 938a in FIG. 9). Therefore, tIPBSY was introduced to provide time to allow an operation to complete loading of data into the left RAM before starting loading of data into the right RAM (e.g., RAM 938b in FIG. 9).

However, the flag bit architecture of the present invention (e.g., flag field 935-3, flag field 937-3 etc.) may not need the tIPBSY time, and likewise may not need other circuitries which are required in conventional devices. In particular, the present invention may avoid running an internal dedicated logic to flush the pipeline, by using a transition of the write enable signal WE # that specs guarantee out of data-in phase to store the last data into the RAM (e.g., RAM 938). Using this approach, the busy time between the two phases is not required.

That is, the present invention may utilize all cycles of the write enable signal WE # (i.e., not only data cycles) to put forward pipeline logic. This may allow the present invention to avoid additional circuitry needing to be managed with a internal clock that has to be switched on/switched off properly to guarantee tIPBSY matching. Thus, an advantage of the present invention is that no "dead" time (tIPBSY) is required in interleaved commands and no additive logic must be managed in tIPBSY time.

Note that the tIPBSY time is specified only for interleaved commands. If a command is not interleaved, then a long busy time starts at the end of a sequence, and tIPBSY is included in the long busy time.

In conventional devices, tADL is required between "loading address" and data-in phase to manage more complex circuitry than described in present proposal. tADL and tCCS are minimum times guaranteed by specification between the last byte of address and the first data to be programmed. More precisely, tADL refers to commands (e.g., page program, copyback, interleaved) where a 5-byte address must be provided. tCCS refers to commands (e.g., Change Write Column) where a 2-byte address must be provided. Typically, in conventional devices, this timing is of dozens of microseconds and is required to properly start up all of the logic involved in the data-in phase.

However, for the flag bit architecture of the present invention, only the tWC time is important and can be minimized. That is, an exemplary aspect of the present invention (e.g., due to very minimal and fast flag logic) needs only a very short time (e.g., tWC is enough time). In addition, to be initialized, an exemplary aspect of the present invention may require only the valid signal ALE_DONE and the enable/disable signal DIN_PHASE from the command interface to the first pipeline logic 935, as illustrated in FIG. 9. Conventional architectures, on the other hand, may need a long time and may require a more complex initialization approach.

Figure 15:
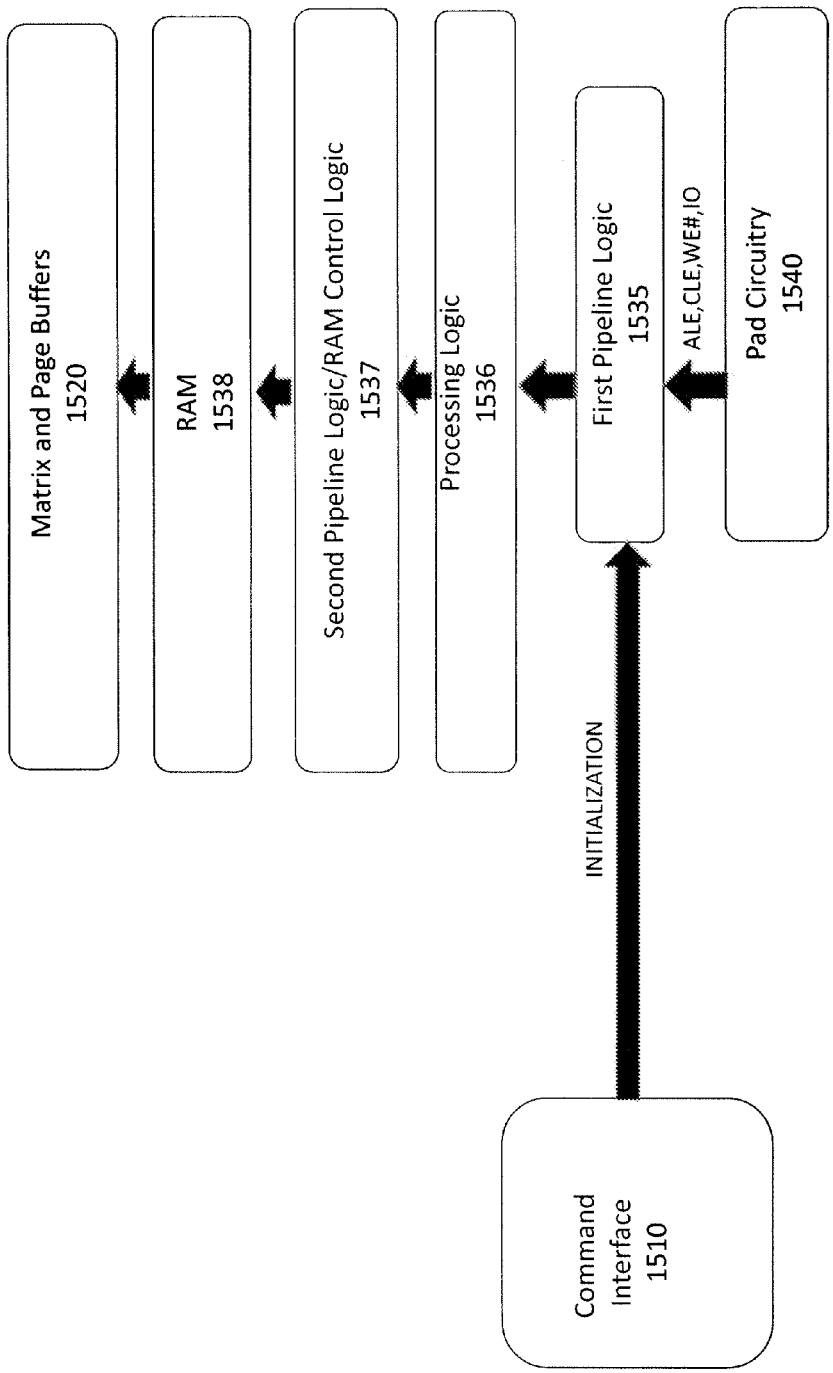
FIG. 15 illustrates a device 1500 including an architecture having a general embodiment of data-in management, according to an exemplary aspect of the present invention.

Referring again to the drawings, FIG. 15 illustrates a device 1500 including an architecture having a general embodiment of data-in management, according to an exemplary aspect of the present invention. That is, the present invention is not necessarily limited to the architecture of FIGS. 9 and 10, but may use flag bits to manage data validity regarding data-in phase of all kinds of program commands, such as in the device 1500.

As illustrated in FIG. 15, the device 1500 includes a command interface 1510 which has the task to initialize and switch "ON" the first pipeline logic 1535 which is placed close to the pad circuitry 1540. The first pipeline logic 1535 after initialization has the task of preserving alignment of data/address, and the task of flagging data validity. The device 1500 also includes processing logic 1536 (e.g., second flagged pipeline level) which has the task to guarantee optimization of setup/hold timing of RAM 1538 or buffer writing. The device 1500 also includes matrix and page buffers 1520. The device may also include a second pipeline logic/RAM control logic 1537, depending on the kind of memory organization in the device 1500.

It should be noted that the above descriptions of the present invention are merely exemplary and should not be considered as limiting the present invention. In particular, the present invention can be easily extended to memory having different IO width. The present invention can also be equally applicable to synchronous and asynchronous interfaces (e.g., synchronous NAND interface and asynchronous NAND interface).

Further, although the exemplary aspect in FIGS. 9 and 10 includes only two (2) pipeline levels (e.g., first pipeline logic 935 and second pipeline logic 937), the present invention may also be applicable to a logic circuit having more than two (2) pipeline levels.

Further, the present invention is not limited to use with data for a program algorithm, but could be used for other data (e.g., data which is not for a program algorithm).

Further, various signals (e.g., VCC, RE #, WE #, CE #, ALE, CLE, WP and DQ) which may be used in the present invention may be generated by a digital processing apparatus (e.g., computer, cellular phone, etc.). For example, the device 800 in FIG. 8 may be connectable (e.g., fixedly connectable, removably connectable, wirelessly connectable, etc.) to such a digital processing apparatus via the pads for receiving VCC, RE #, WE #, CE #, ALE, CLE, WP and DQ which are illustrated in FIG. 8.

Further, the present invention may also include a programmable storage medium tangibly embodying a program of machine-readable instructions executable by a digital processing apparatus to perform method of managing a data-in operation (e.g., method 700) according to an exemplary aspect of the present invention.

With its unique and novel features, the exemplary aspects of the present invention may provide a circuit and method which may effectively and efficiently manage an operation (e.g., a data-in operation) in a semiconductor memory device.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A logic circuit for a semiconductor memory device, the logic circuit comprising:
   a first logic portion which stores data from a first data signal, and generates a second data signal based on the first data signal;
   a second logic portion which generates a first address signal, and stores an address from the first address signal where data from the second data signal is to be written; and
   a third logic portion which generates a flag signal which indicates whether the data stored in the first logic portion is valid.

2. The logic circuit of claim 1, wherein the semiconductor memory device comprises a buffer, and the address stored in the second logic portion comprises an address where data from the second data signal is to be written in the buffer, and
   wherein the first logic portion comprises a plurality of flip-flops which store the data from the first data signal which is valid data independently of the data from the first data signal which is invalid data, the valid data having the buffer as a correct destination and the invalid data not having the buffer as a correct destination.

3. The logic circuit of claim 1, wherein the second logic portion receives a column address signal and a valid signal from a command interface of the semiconductor memory device, and the third logic portion receives an enable/disable signal from the command interface, and
   wherein the second logic portion comprises a plurality of flip-flops which store the address from the first address signal, the address being initialized by the column address signal when the valid signal goes to a first level and the enable/disable signal is at the first level.

4. The logic circuit of claim 3, wherein a latching of the data in the third logic portion is controlled by a write enable signal, and
   wherein the data is valid if, on an edge of the write enable signal, the enable/disable signal is at the first level, the address latch enable signal is at a second level, and the command latch enable signal is at the second level.

5. The logic circuit of claim 1, wherein if the flag signal has a first value, then the data associated with the first value and stored in the first logic portion is valid and will be written on a cycle of a write enable signal at the address which is associated with the data and stored in the second logic portion.

6. The logic circuit of claim 1, wherein the second logic portion comprises a log which, after initialization, provides sequential addresses associated with next data of the first data signal which is input to the first logic portion, and if the next data is not valid data, then the address in the second logic portion is not incremented.

7. The logic circuit of claim 1, wherein the third logic portion comprises a flip-flop including an input which comprises a minimum logic.

8. A device comprising:
   a set of terminals supplied with a plurality of input data in sequence;
   an input circuit coupled to the set of terminals to receive each of the input data in sequence, the input circuit being configured to temporarily store each of the input data and producing in sequence a plurality of internal data corresponding respectively to the input data with a plurality of flag signals, each of the flag signals accompanying an associated one of the internal data and taking one of first and second states, the first state indicating that an accompanied one of the internal data is valid and the second state indicating that the accompanied one of the internal data is invalid;

a storage area; and a control circuit coupled between the input circuit and the storage area and configured to respond to the flag signals and write into the storage area one or ones of the internal data that is or are indicated to be valid by the first state of associated one or ones of the flag signals with preventing the storage area from being written with remaining one or ones of the internal data that is or are indicated to be invalid by the second state of the flag signals.

9. The device of claim 8, wherein the input circuit comprises a data field circuit and a flag circuit, the data field circuit temporarily storing the input data and producing the internal data, and the flag circuit producing the flag signals that accompany the internal data, respectively.

10. The device of claim 9, wherein the device further comprises a set of control terminals supplied with control signals, the control signals representing a plurality of logic combinations each indicative of a nature of each of the input data, and the flag circuit is electrically coupled to the set of the control terminals to control each of the flag signals to be one of the first and second states in response to the logic combinations of the control signals.

11. The device of claim 8, wherein the input circuit is further configured to produce address information, the address information being updated in content each time when the internal data accompanied by a corresponding flag signal taking the first state is produced and being not updated in content when the internal data accompanied by a corresponding flag signal taking the second state is produced.

12. The device of claim 11, wherein the address information is being supplied to the storage area to indicate each of addresses of the storage area into which the internal data accompanied by the flag signals each taking the first state are written.

13. The device of claim 8, wherein the input circuit comprises a redundancy circuit performing redundancy operation on the internal data.

14. The device of claim 8, wherein the device further comprises a first control terminal supplied with a write-enable signal, and wherein the input data are supplied in sequence to the set of terminals in synchronism with the write-enable signal and the flag signals are produced in response to the write-enable signal.

15. The device of claim 14, wherein the device further comprises a second control terminal supplied with an address latch-enable signal, a third control terminal supplied with a command latch-enable signal, the address latch-enable signal and the command latch-enable signal representing a plurality of logic combinations each indicative of a nature of each of the input data, and the flag circuit is electrically coupled to the first, second and third control terminals to control each of the flag signals to take one of the first and second states in response to the logic combinations.

16. A device comprising:
a nonvolatile memory cell array;
a page buffer temporarily storing data to be written into the nonvolatile memory cell array;
a volatile memory cell array temporarily storing data to be written into the page buffer;
a pad circuit receiving a plurality of input data in sequence; and
a pipeline circuit coupled between the pad circuit and the volatile memory cell array, the pipeline circuit being configured to produce in sequence a plurality of internal data in response respectively to the input data with a plurality of flag signals to be accompanied respectively by the internal data, each of the flag signals taking a first level when an associated one of the internal data is valid and a second level when the associated one of the internal data is invalid, the pipeline circuit being further configured to write into the volatile memory cell array such one or ones of the internal data that accompany corresponding flag signal or signals each taking the first level;
the one or ones of the internal data that accompany corresponding flag signal or signals each taking the first level being thereby written into the nonvolatile memory cell array through the page buffer.

17. The device of claim 16, wherein the nonvolatile memory cell array comprises a NAND flash memory and the volatile memory cell array comprises a SRAM (Static Random Access Memory).

18. The device of claim 16, wherein the pad circuit further receives a set of control signals, and the pipeline circuit comprises a data field circuit that temporarily stores the input data and produces the internal data and a flag circuit that produces the flag signals and control each of the flag signals to take one of the first and second levels in response to the set of control signals.

19. The device of claim 17, wherein the NAND flash memory includes first and second planes, and the page buffer includes first and second buffers correspondingly to the first and second planes, the SRAM including first and second storage areas correspondingly to the first and second buffers, the internal data and the flag signals being divided into first and second groups correspondingly the first and second storage area.

20. The device of claim 19, wherein the pipeline circuit comprises first and second data write control circuits, the first data write control circuit performing a data write operation on the first group of the internal data to write into the first data storage area such one or ones of the first group of the internal data that accompany corresponding flag signal or signals of the first group each taking the first level, and the second data write control circuit performing a data write operation on the second group of the internal data to write into the second data storage area such one or ones of the second group of the internal data that accompany corresponding flag signal or signals of the second group each taking the first level.

* * * * *